United States Patent
Ide et al.

(10) Patent No.: US 7,564,661 B2
(45) Date of Patent: Jul. 21, 2009

(54) MAGNETIC SENSING ELEMENT INCLUDING FREE LAYER HAVING GRADIENT COMPOSITION AND METHOD FOR MANUFACTURING THE SAME

(75) Inventors: Yosuke Ide, Niigata-ken (JP); Masamichi Saito, Niigata-ken (JP); Masahiko Ishizone, Niigata-ken (JP); Naoya Hasegawa, Niigata-ken (JP)

(73) Assignee: TDK Corporation, Tokyo (JP)

(*) Notice: Subject to any disclaimer, the term of this patent is extended or adjusted under 35 U.S.C. 154(b) by 704 days.

(21) Appl. No.: 11/352,958

(22) Filed: Feb. 13, 2006

(65) Prior Publication Data

US 2006/0188750 A1 Aug. 24, 2006

(30) Foreign Application Priority Data

Feb. 23, 2005 (JP) .............................. 2005-046356

(51) Int. Cl.
*G11B 5/127* (2006.01)
(52) U.S. Cl. ................................. 360/324.12
(58) Field of Classification Search ............. 360/324.12
See application file for complete search history.

(56) References Cited

U.S. PATENT DOCUMENTS

| | | | |
|---|---|---|---|
| 7,220,499 B2* | 5/2007 | Saito et al. ............... | 428/811.5 |
| 7,365,949 B2* | 4/2008 | Hayakawa et al. ........ | 360/324.1 |
| 7,428,130 B2* | 9/2008 | Jogo et al. ............. | 360/324.12 |
| 2004/0207962 A1* | 10/2004 | Saito et al. ............. | 360/324.11 |
| 2005/0270703 A1* | 12/2005 | Hayakawa et al. ........ | 360/324.1 |
| 2006/0203396 A1* | 9/2006 | Ide et al. .................. | 360/324.1 |
| 2007/0047158 A1* | 3/2007 | Hayashi et al. ......... | 360/324.11 |
| 2007/0063236 A1* | 3/2007 | Huai et al. .................. | 257/295 |
| 2007/0171694 A1* | 7/2007 | Huai et al. .................. | 365/145 |

FOREIGN PATENT DOCUMENTS

| | | |
|---|---|---|
| JP | 2003-309305 | 10/2003 |
| JP | 2003-338644 | 11/2003 |

* cited by examiner

*Primary Examiner*—Allen T Cao
(74) *Attorney, Agent, or Firm*—Brinks Hofer Gilson & Lione

(57) ABSTRACT

A magnetic sensing element which allows a high reproduction output and reduction in asymmetry of reproduction waveform to become mutually compatible, as well as a method for manufacturing the same, is provided. In the inside of a second pinned magnetic layer and a free magnetic layer, the atomic percentage of an element Z is decreased in a region close to a non-magnetic material layer. Consequently, the ferromagnetic coupling magnetic field due to magnetostatic coupling (topological coupling) between the pinned magnetic layer and the free magnetic layer can be reduced. At the same time, in a region at a distance from the non-magnetic material layer, the atomic percentage of an element Z is increased, a spin-dependent bulk scattering coefficient is increased, and a product of the amount of change in magnetic resistance and the element area of the magnetic sensing element can be maintained at a high level.

36 Claims, 6 Drawing Sheets

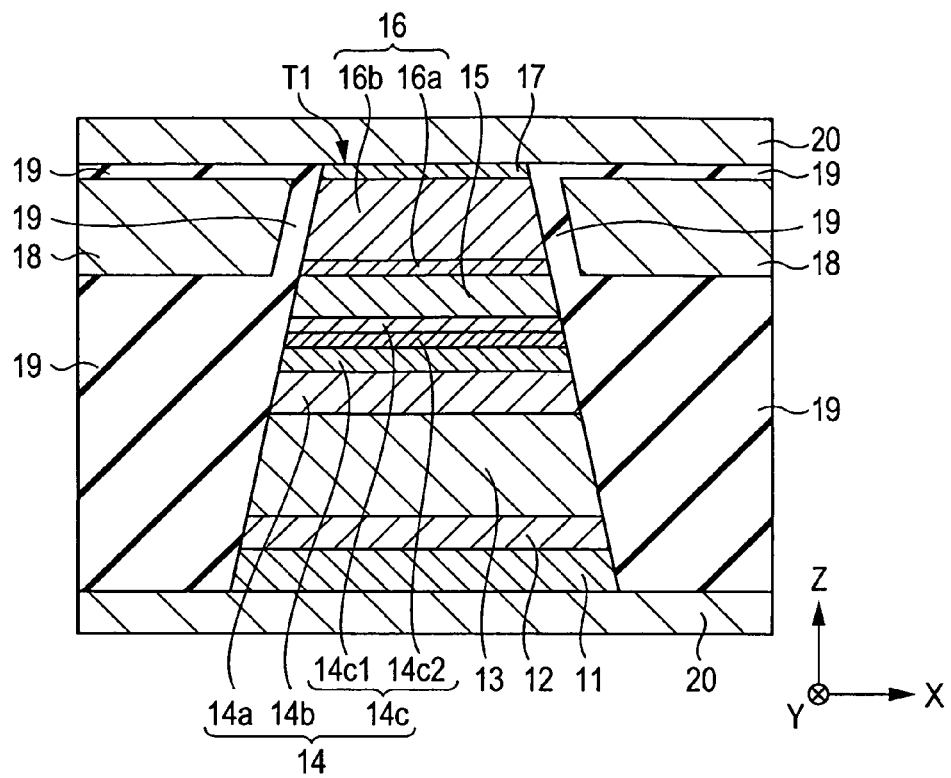
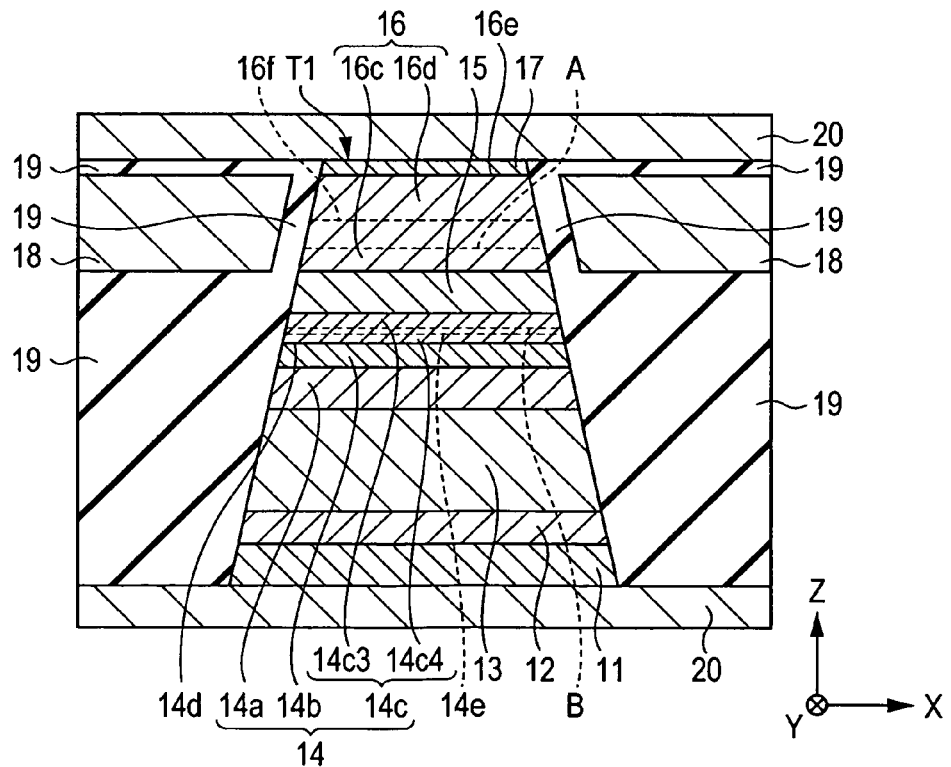

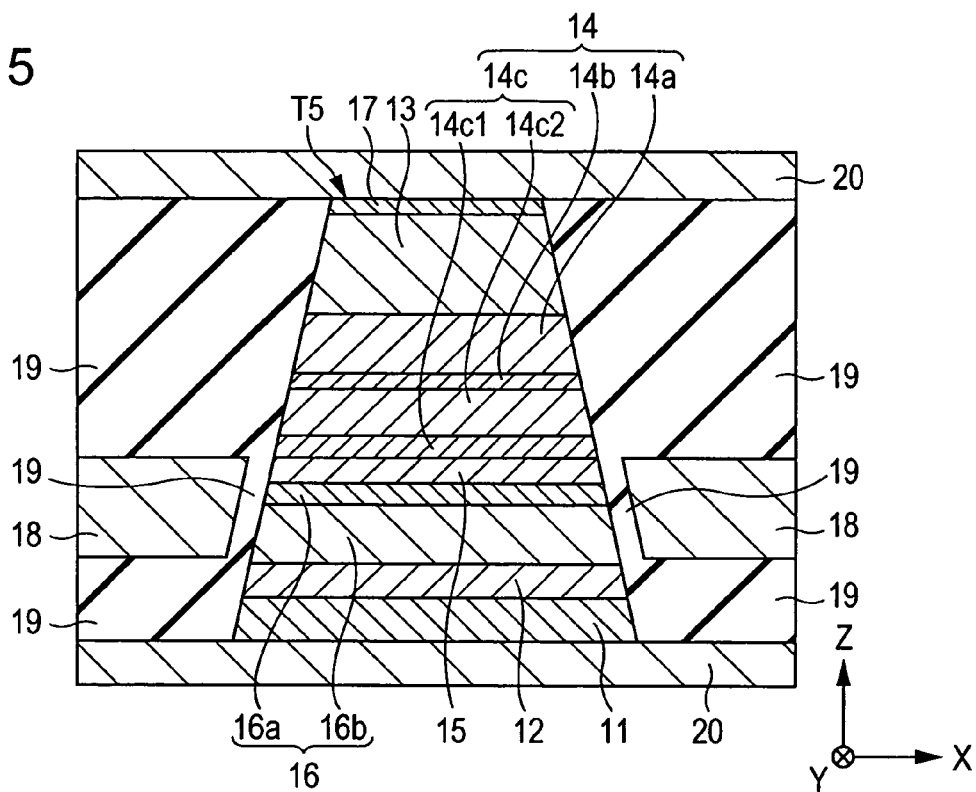
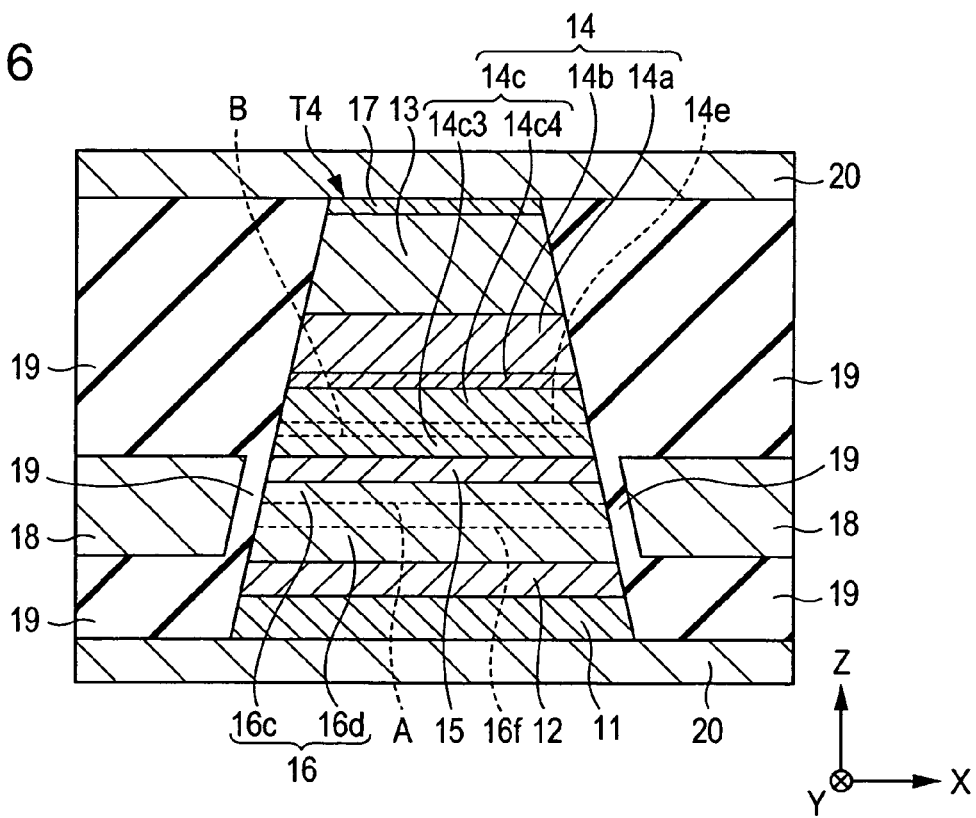

MAGNETIC SENSING ELEMENT INCLUDING FREE LAYER HAVING GRADIENT COMPOSITION AND METHOD FOR MANUFACTURING THE SAME

BACKGROUND OF THE INVENTION

1. Field of the Invention

The present invention relates to a magnetic sensing element including a pinned magnetic layer, in which the magnetization direction is pinned in one direction, and a free magnetic layer disposed on the above-described pinned magnetic layer with a non-magnetic material layer therebetween. In particular, it relates to a magnetic sensing element capable of stabilizing a reproduction output.

2. Description of the Related Art

FIG. 9 is a partial sectional view of a known magnetic sensing element (spin-valve type thin film element) cut from a direction parallel to a surface facing a recording medium.

Reference numeral 1 shown in FIG. 9 denotes a substrate layer made of Ta, and a seed layer 2 made of NiFeCr or the like is disposed on the substrate layer 1.

A multilayer film T, in which an antiferromagnetic layer 3, a pinned magnetic layer 4, a non-magnetic material layer 5, a free magnetic layer 6, and a protective layer 7 are laminated sequentially, is disposed on the seed layer 2.

The free magnetic layer 6 and the pinned magnetic layer 4 are formed from a Heusler alloy, e.g., $Co_2MnGe$. The non-magnetic material layer 5 is formed from Cu. The antiferromagnetic layer 3 is formed from PtMn. The protective layer 7 is formed from Ta.

An exchange coupling magnetic field is generated at the interface between the antiferromagnetic layer 3 and the pinned magnetic layer 4 and, thereby, the magnetization of the above-described pinned magnetic layer 4 is pinned in a height direction (Y direction shown in the drawing).

Hard bias layers 8 made of a hard magnetic material, e.g., CoPt, are disposed on both sides of the free magnetic layer 6. The top, the bottom, and the end portions of the hard bias layer 8 are insulated by an insulating layer 9. The magnetization of the free magnetic layer 6 is aligned in a track-width direction (X direction shown in the drawing) by longitudinal bias magnetic fields from the hard bias layers 8. Electrode layers 10 and 10 are disposed on and under the multilayer film T.

When an external magnetic field is applied to the magnetic sensing element shown in FIG. 9, the magnetization direction of the free magnetic layer is varied relatively to the magnetization direction of the pinned magnetic layer and, thereby, the resistance value of the multilayer film is varied. In the case where a sensing current of a constant current value is passed, the external magnetic field can be detected by detecting this change in resistance value as a change in voltage.

A magnetic sensing element including a pinned magnetic layer made of a Heusler alloy is described in Japanese Unexamined Patent Application Publication No. 2003-309305 (page 8, FIG. 4).

FIG. 10 is a magnified partial schematic diagram of the structure of the magnetic sensing element shown in FIG. 9. It is difficult to completely flatten the surface of the pinned magnetic layer 4 and, usually, minute waves are generated on the surface. If the waves are generated on the surface of the pinned magnetic layer 4, analogous waves are generated on the surfaces of the non-magnetic material layer 5 and the free magnetic layer 6.

When such a wave is generated, as shown in FIG. 10 (a schematic diagram showing cross sections of the pinned magnetic layer 4, the non-magnetic material layer 5, and the free magnetic layer 6 shown in FIG. 9, cut in the Y direction), magnetic poles are generated at the wave portion on the surface of the pinned magnetic layer 4. The above-described magnetic poles are also generated at the wave portion on the free magnetic layer 6 facing the pinned magnetic layer 4 with the non-magnetic material layer 5 therebetween. Consequently, the ferromagnetic coupling magnetic field $H_{in}$ due to the magnetostatic coupling (topological coupling) between the pinned magnetic layer 4 and the free magnetic layer 6 is enhanced. Therefore, the free magnetic layer 6, which must be magnetized essentially in the X direction shown in the drawing, is subjected to the action to magnetize in the Y direction shown in the drawing, and a problem occurs in that the asymmetry of the reproduction waveform is increased when an external magnetic field is applied in a direction different by 180 degrees.

SUMMARY OF THE INVENTION

The present invention is to overcome the above-described known problems. Accordingly, it is an object of the present invention to provide a magnetic sensing element which allows a high reproduction output and reduction in asymmetry of reproduction waveform in the magnetic sensing element to become mutually compatible by devising the configuration of a free magnetic layer or a pinned magnetic layer, as well as a method for manufacturing the same.

An aspect of the present invention relates to a magnetic sensing element including a pinned magnetic layer, in which the magnetization direction is pinned in one direction, and a free magnetic layer disposed on the above-described pinned magnetic layer with a non-magnetic material layer therebetween, the magnetic sensing element characterized in that the above-described free magnetic layer includes a layer made of a metal compound represented by a compositional formula of $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and a region, in which the atomic percentage of the element Z in the above-described metal compound is decreased with increasing proximity to the above-described non-magnetic material layer side, is present in the above-described free magnetic layer, wherein the above-described X is at least one element of Cu, Co, Ni, Rh, Pt, Au, Pd, Ir, Ru, Ag, Zn, Cd, and Fe, the above-described Y is at least one element of Mn, Fe, Ti, V, Zr, Nb, Hf, Ta, Cr, Co, and Ni, and the above-described Z is at least one element of Al, Sn, In, Sb, Ga, Si, Ge, Pb, and Zn.

In the present aspect, the atomic percentage of the element Z, which is at least one element of Al, Sn, In, Sb, Ga, Si, Ge, Pb, and Zn, among the constituent elements of the above-described metal compound constituting the above-described free magnetic layer is decreased in a region close to the above-described non-magnetic material layer. Consequently, the ferromagnetic coupling magnetic field $H_{in}$ due to the magnetostatic coupling (topological coupling) between the above-described free magnetic layer and the above-described pinned magnetic layer can be reduced.

Furthermore, in the above-described free magnetic layer, the atomic percentage of the above-described element Z is increased and a spin-dependent bulk scattering coefficient β is increased in a region at a distance from the above-described non-magnetic material layer, so that a product ΔRA of the amount of change ΔR in magnetic resistance and the element area A of the magnetic sensing element can be maintained at a high level.

As described above, the magnetic sensing element of the present aspect allows a high reproduction output and reduction in asymmetry of reproduction waveform to become mutually compatible.

In the compositional formula $(X_{0.67}Y_{0.33})_aZ_b$ of the above-described metal compound, numbers in the parentheses represent the proportions of the element X and the element Y. That is, the number of the element X contained is twice as much as the number of the element Y. Hereafter, the number of 1 or less in parentheses in a compositional formula represents the proportion of an element in the parentheses.

In the present aspect, it is preferable that when a virtual boundary is set in a direction parallel to the interface between the above-described free magnetic layer and the above-described non-magnetic material layer in the film thickness of the above-described free magnetic layer, a first region is assumed to be from the above-described virtual boundary to the above-described interface, and a second region is assumed to be the region from the above-described virtual boundary to a surface opposite to the above-described interface, the atomic percentage of the element Z in the above-described metal compound is decreased continuously or discontinuously from the above-described second region toward the first region in regions sandwiching the above-described virtual boundary.

Whether the atomic percentage of the element Z in the above-described metal compound is decreased continuously or decreased discontinuously in the regions sandwiching the above-described virtual boundary depends on a method for manufacturing the magnetic sensing element, as described below.

Another aspect of the present invention relates to a magnetic sensing element including a pinned magnetic layer, in which the magnetization direction is pinned in one direction, and a free magnetic layer disposed on the above-described pinned magnetic layer with a non-magnetic material layer therebetween, the magnetic sensing element characterized in that the above-described pinned magnetic layer includes a layer made of a metal compound represented by a compositional formula of $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent); and a region, in which the atomic percentage of the element Z in the above-described metal compound is decreased with increasing proximity to the above-described non-magnetic material layer side, is present in the above-described pinned magnetic layer, wherein the above-described X is at least one element of Cu, Co, Ni, Rh, Pt, Au, Pd, Ir, Ru, Ag, Zn, Cd, and Fe, the above-described Y is at least one element of Mn, Fe, Ti, V, Zr, Nb, Hf, Ta, Cr, Co, and Ni, and the above-described Z is at least one element of Al, Sn, In, Sb, Ga, Si, Ge, Pb, and Zn.

In the present aspect, the atomic percentage of the element Z, which is at least one element of Al, Sn, In, Sb, Ga, Si, Ge, Pb, and Zn, among the constituent elements of the above-described metal compound constituting the above-described pinned magnetic layer is decreased in a region close to the above-described non-magnetic material layer. Consequently, the ferromagnetic coupling magnetic field $H_{in}$ due to the magnetostatic coupling (topological coupling) between the above-described free magnetic layer and the above-described pinned magnetic layer can be reduced.

Furthermore, in the above-described pinned magnetic layer, the atomic percentage of the above-described element Z is increased and a spin-dependent bulk scattering coefficient β is increased in a region at a distance from the above-described non-magnetic material layer, so that a product ΔRA of the amount of change ΔR in magnetic resistance and the element area A of the magnetic sensing element can be maintained at a high level.

As described above, the magnetic sensing element of the present aspect allows a high reproduction output and reduction in asymmetry of reproduction waveform to become mutually compatible.

It is preferable that when a virtual boundary is set in a direction parallel to the interface between the above-described pinned magnetic layer and the above-described non-magnetic material layer in the film thickness of the above-described pinned magnetic layer, a first region is assumed to be from the above-described virtual boundary to the above-described interface, and a second region is assumed to be the region from the above-described virtual boundary to a surface opposite to the above-described interface, the atomic percentage of the element Z in the above-described metal compound is decreased continuously or discontinuously from the above-described second region toward the first region in regions sandwiching the above-described virtual boundary.

Whether the atomic percentage of the element Z in the above-described metal compound is decreased continuously or decreased discontinuously in the regions sandwiching the above-described virtual boundary depends on a method for manufacturing the magnetic sensing element, as described below.

Preferably, the atomic percentage of the element Z in the above-described metal compound in the neighborhood of the center of the above-described free magnetic layer or the pinned magnetic layer is more than 24 atomic percent and 26 atomic percent or less.

When the atomic percentage of the element Z in the above-described metal compound is more than 24 atomic percent and 26 atomic percent or less, the above-described metal compound tends to take on an $L_{21}$ type crystal structure, and the spin-dependent bulk scattering coefficients β of the above-described free magnetic layer and the above-described pinned magnetic layer are increased. That is, the spin dependence of conductive electrons passing the above-described free magnetic layer and the above-described pinned magnetic layer is increased. Therefore, the product ΔRA of the amount of change ΔR in magnetic resistance and the element area A of the magnetic sensing element can be increased.

In order to reduce the ferromagnetic coupling magnetic field $H_{in}$ due to the magnetostatic coupling (topological coupling) between the above-described free magnetic layer and the above-described pinned magnetic layer, it is preferable that the atomic percentage of the element Z in the above-described metal compound in the neighborhood of the interface of the above-described free magnetic layer or the pinned magnetic layer to the above-described non-magnetic material layer is 19 atomic percent or more and 24 atomic percent or less.

A more preferable range of the atomic percentage of the element Z in the above-described metal compound in the neighborhood of the interface of the above-described free magnetic layer or the pinned magnetic layer to the above-described non-magnetic material layer is 22 atomic percent or less.

Furthermore, in order to allow a high reproduction output and reduction in asymmetry of reproduction waveform to become mutually compatible, it is preferable that the difference between the atomic percentage of the element Z in the above-described metal compound in the neighborhood of the center of the above-described free magnetic layer or the pinned magnetic layer and the atomic percentage of the element Z in the above-described metal compound in the neighborhood of the interface of the above-described free magnetic layer or the pinned magnetic layer to the above-described non-magnetic material layer is specified to be 3 atomic percent or more.

Preferably, the above-described metal compound is any one of the following compounds represented by respective compositional formulae.

1. A metal compound represented by a compositional formula of $(Co_{0.67}Y_{0.33})_aZ_b$ (where a and b represent atomic percentages, and a+b=100 atomic percent), wherein the above-described Y is at least one element of Mn, Fe, and Cr, and the above-described Z is at least one element of Al, Ga, Si, and Ge.

2. A metal compound represented by a compositional formula of $(Co_{0.67}Mn_{0.33})_aZ_b$ (where a and b represent atomic percentages, and a+b=100 atomic percent), wherein the above-described Z is Si or Ge.

3. A metal compound represented by a compositional formula of $(Co_{0.67}Mn_{0.33})_aGe_b$ (where a and b represent atomic percentages, and a+b=100 atomic percent).

The present invention is particularly effective when the film thickness of the above-described non-magnetic material layer of the magnetic sensing element is 18 angstroms or more and 50 angstroms or less. The specific configuration of the magnetic sensing element of the present invention is, for example, a single spin-valve type magnetoresistive element including an antiferromagnetic layer, the above-described pinned magnetic layer, which is disposed in contact with the antiferromagnetic layer and in which the magnetization direction is pinned by an exchange anisotropic magnetic field with the above-described antiferromagnetic layer, and the above-described free magnetic layer disposed on the above-described pinned magnetic layer with the above-described non-magnetic material layer therebetween.

Alternatively, the specific configuration of the magnetic sensing element of the present invention is a dual spin-valve type magnetoresistive element including non-magnetic material layers laminated on and under the above-described free magnetic layer, and the above-described pinned magnetic layers located on one of the above-described non-magnetic material layers and under the other non-magnetic material layer. At this time, antiferromagnetic layers, which are located on one of the above-described pinned magnetic layers and under the other pinned magnetic layer and which pin the magnetization directions of the respective above-described pinned magnetic layers in constant directions by exchange anisotropic magnetic fields, may be included.

The present invention is effective when applied to a CPP (current perpendicular to the plane)-GMR type magnetic sensing element and a CPP-TMR (tunnel effect magnetoresistive element), wherein a sensing current is passed in a direction perpendicular to film surfaces of the above-described pinned magnetic layer, the non-magnetic material layer, and the free magnetic layer.

The metal compounds which are materials for the free magnetic layer and the pinned magnetic layer of the magnetic sensing element in the present invention are metals having large spin polarizabilities and have properties similar to those of half-metals in which conductive electrons include up spin electrons and down spin electrons in such a way that a proportion of one type is larger than that of the other type.

When these metal compounds are used as materials for the free magnetic layer or the pinned magnetic layer of the CPP-GMR type or CPP-TMR type magnetic sensing element, the amount of change in the spin diffusion length or the mean free path of conductive electrons in the inside of the magnetic sensing element based on the change in spin-dependent bulk scattering before and after the application of the external magnetic field is increased. That is, the amount of change in resistance value of the magnetic sensing element is increased and, thereby, the detection sensitivity to the external magnetic field is improved.

Another aspect of the present invention relates to a method for manufacturing a magnetic sensing element including a pinned magnetic layer, in which the magnetization direction is pinned in one direction, and a free magnetic layer disposed on the above-described pinned magnetic layer with a non-magnetic material layer therebetween, the method characterized by including the steps of forming the above-described free magnetic layer as a laminate of a first free magnetic layer in contact with the above-described non-magnetic material layer and a second free magnetic layer stacked on the above-described first free magnetic layer; forming the above-described first free magnetic layer and the second free magnetic layer from metal compounds represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent); and specifying the atomic percentage of the element Z in the metal compound constituting the above-described first free magnetic layer to be smaller than the atomic percentage of the element Z in the metal compound constituting the above-described second free magnetic layer, wherein the above-described X is at least one element of Cu, Co, Ni, Rh, Pt, Au, Pd, Ir, Ru, Ag, Zn, Cd, and Fe, the above-described Y is at least one element of Mn, Fe, Ti, V, Zr, Nb, Hf, Ta, Cr, Co, and Ni, and the above-described Z is at least one element of Al, Sn, In, Sb, Ga, Si, Ge, Pb, and Zn.

In the present aspect, the atomic percentage of the element Z in the metal compound constituting the above-described first free magnetic layer is specified to be smaller than the atomic percentage of the element Z in the metal compound constituting the above-described second free magnetic layer and, thereby, the atomic percentage of the element Z, which is at least one element of Al, Sn, In, Sb, Ga, Si, Ge, Pb, and Zn, can be decreased in a region close to the above-described non-magnetic material layer. Consequently, the ferromagnetic coupling magnetic field $H_{in}$ due to the magnetostatic coupling (topological coupling) between the above-described free magnetic layer and the above-described pinned magnetic layer can be reduced.

Furthermore, in the above-described free magnetic layer, the atomic percentage of the above-described element Z is increased and a spin-dependent bulk scattering coefficient β is increased in a region at a distance from the above-described non-magnetic material layer, so that a product ΔRA of the amount of change ΔR in magnetic resistance and the element area A of the magnetic sensing element can be maintained at a high level.

As described above, the magnetic sensing element produced according to the present aspect allows a high reproduction output and reduction in asymmetry of reproduction waveform to become mutually compatible.

In the present aspect, it is preferable that the atomic percentage of the element Z in the above-described metal compound of the above-described second free magnetic layer is specified to be more than 24 atomic percent and 26 atomic percent or less.

Preferably, the atomic percentage of the element Z in the above-described metal compound of the above-described first free magnetic layer is specified to be 19 atomic percent or more and 24 atomic percent or less. More preferably, the atomic percentage of the element Z in the above-described metal compound of the above-described first free magnetic layer is specified to be 22 atomic percent or less.

Preferably, the difference between the atomic percentage of the element Z in the above-described metal compound of the above-described second free magnetic layer and the atomic percentage of the element Z in the metal compound of the above-described first free magnetic layer is specified to be 3 atomic percent or more.

Another aspect of the present invention relates to a method for manufacturing a magnetic sensing element including a pinned magnetic layer, in which the magnetization direction is pinned in one direction, and a free magnetic layer disposed on the above-described pinned magnetic layer with a non-magnetic material layer therebetween, the method characterized by including the steps of forming the above-described pinned magnetic layer as a laminate of a first pinned magnetic layer in contact with the above-described non-magnetic material layer and a second pinned magnetic layer stacked on the above-described first pinned magnetic layer; forming the above-described first pinned magnetic layer and the second pinned magnetic layer from metal compounds represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and specifying the atomic percentage of the element Z in the metal compound constituting the above-described first pinned magnetic layer to be smaller than the atomic percentage of the element Z in the metal compound constituting the above-described second pinned magnetic layer, wherein the above-described X is at least one element of Cu, Co, Ni, Rh, Pt, Au, Pd, Ir, Ru, Ag, Zn, Cd, and Fe, the above-described Y is at least one element of Mn, Fe, Ti, V, Zr, Nb, Hf, Ta, Cr, Co, and Ni, and the above-described Z is at least one element of Al, Sn, In, Sb, Ga, Si, Ge, Pb, and Zn.

In the present aspect, the atomic percentage of the element Z in the metal compound constituting the above-described first pinned magnetic layer is specified to be smaller than the atomic percentage of the element Z in the metal compound constituting the above-described second pinned magnetic layer and, thereby, the atomic percentage of the element Z, which is at least one element of Al, Sn, In, Sb, Ga, Si, Ge, Pb, and Zn, can be decreased in a region close to the above-described non-magnetic material layer. Consequently, the ferromagnetic coupling magnetic field $H_{in}$ due to the magnetostatic coupling (topological coupling) between the above-described pinned magnetic layer and the above-described pinned magnetic layer can be reduced.

Furthermore, in the above-described pinned magnetic layer, the atomic percentage of the above-described element Z is increased and a spin-dependent bulk scattering coefficient β is increased in a region at a distance from the above-described non-magnetic material layer, so that a product ΔRA of the amount of change ΔR in magnetic resistance and the element area A of the magnetic sensing element can be maintained at a high level.

As described above, the magnetic sensing element produced according to the present aspect allows a high reproduction output and reduction in asymmetry of reproduction waveform to become mutually compatible.

In the present aspect, it is preferable that the atomic percentage of the element Z in the above-described metal compound of the above-described second pinned magnetic layer is specified to be more than 24 atomic percent and 26 atomic percent or less.

Preferably, the atomic percentage of the element Z in the above-described metal compound of the above-described first pinned magnetic layer is specified to be 19 atomic percent or more and 24 atomic percent or less. More preferably, the atomic percentage of the element Z in the above-described metal compound of the above-described first pinned magnetic layer is specified to be 22 atomic percent or less.

Preferably, the difference between the atomic percentage of the element Z in the above-described metal compound of the above-described second pinned magnetic layer and the atomic percentage of the element Z in the metal compound of the above-described first pinned magnetic layer is specified to be 3 atomic percent or more.

Another aspect of the present invention relates to a method for manufacturing a magnetic sensing element including a pinned magnetic layer, in which the magnetization direction is pinned in one direction, and a free magnetic layer disposed on the above-described pinned magnetic layer with a non-magnetic material layer therebetween, the method characterized by including the steps of forming the above-described free magnetic layer by a sputtering process in which the target is a metal compound represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and conducting film formation of the above-described free magnetic layer at this time in such a way that the atomic percentage of the element Z in the above-described metal compound is decreased with increasing proximity to the above-described non-magnetic material layer side, where the above-described X is at least one element of Cu, Co, Ni, Rh, Pt, Au, Pd, Ir, Ru, Ag, Zn, Cd, and Fe, the above-described Y is at least one element of Mn, Fe, Ti, V, Zr, Nb, Hf, Ta, Cr, Co, and Ni, and the above-described Z is at least one element of Al, Sn, In, Sb, Ga, Si, Ge, Pb, and Zn.

Another aspect of the present invention relates to a method for manufacturing a magnetic sensing element including a pinned magnetic layer, in which the magnetization direction is pinned in one direction, and a free magnetic layer disposed on the above-described pinned magnetic layer with a non-magnetic material layer therebetween, the method characterized by including the steps of forming the above-described pinned magnetic layer by a sputtering process in which the target is a metal compound represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and conducting film formation of the above-described pinned magnetic layer at this time in such a way that the atomic percentage of the element Z in the above-described metal compound is decreased with increasing proximity to the above-described non-magnetic material layer side, wherein the above-described X is at least one element of Cu, Co, Ni, Rh, Pt, Au, Pd, Ir, Ru, Ag, Zn, Cd, and Fe, the above-described Y is at least one element of Mn, Fe, Ti, V, Zr, Nb, Hf, Ta, Cr, Co, and Ni, and the above-described Z is at least one element of Al, Sn, In, Sb, Ga, Si, Ge, Pb, and Zn.

According to these aspects of the present invention as well, in which the above-described free magnetic layer and the above-described pinned magnetic layer are formed by a sputtering process, the ferromagnetic coupling magnetic field $H_{in}$ due to the magnetostatic coupling (topological coupling) between the above-described pinned magnetic layer and the above-described pinned magnetic layer can be reduced, and the asymmetry of reproduction of the magnetic sensing element can be reduced.

Furthermore, in the above-described pinned magnetic layer, the atomic percentage of the above-described element Z is increased and a spin-dependent bulk scattering coefficient β is increased in a region at a distance from the above-described non-magnetic material layer, so that a product ΔRA of the amount of change ΔR in magnetic resistance and the element area A of the magnetic sensing element can be maintained at a high level.

In these aspects of the present invention as well, in which the above-described free magnetic layer and the above-described pinned magnetic layer are formed by a sputtering process, it is preferable that the atomic percentage of the element Z in the above-described metal compound in the neighborhood of the center of the above-described free magnetic layer or the pinned magnetic layer is specified to be more than 24 atomic percent and 26 atomic percent or less.

It is preferable that the atomic percentage of the element Z in the above-described metal compound in the neighborhood of the interface of the above-described free magnetic layer or the pinned magnetic layer to the above-described non-magnetic material layer is specified to be 19 atomic percent or more and 24 atomic percent or less. More preferably, the atomic percentage of the element Z in the above-described metal compound in the neighborhood of the interface of the above-described free magnetic layer or the pinned magnetic layer to the above-described non-magnetic material layer is specified to be 22 atomic percent or less.

Furthermore, it is preferable that the difference between the atomic percentage of the element Z in the above-described metal compound in the neighborhood of the center of the above-described free magnetic layer or the pinned magnetic layer and the atomic percentage of the element Z in the above-described metal compound in the neighborhood of the interface of the above-described free magnetic layer or the pinned magnetic layer to the above-described non-magnetic material layer is specified to be 3 atomic percent or more.

Preferably, the above-described metal compound is any one of the following compounds represented by respective compositional formulae.

1. A metal compound represented by a compositional formula of $(Co_{0.67}Y_{0.33})_aZ_b$ (where a and b represent atomic percentages, and a+b=100 atomic percent), wherein the above-described Y is at least one element of Mn, Fe, and Cr, and the above-described Z is at least one element of Al, Ga, Si, and Ge.

2. A metal compound represented by a compositional formula of $(Co_{0.67}Mn_{0.33})_aZ_b$ (where a and b represent atomic percentages, and a+b=100 atomic percent), wherein the above-described Z is Si or Ge.

3. A metal compound represented by a compositional formula of $(Co_{0.67}Mn_{0.33})_aGe_b$ (where a and b represent atomic percentages, and a+b=100 atomic percent).

The present invention is particularly effective when the film thickness of the above-described non-magnetic material layer of the magnetic sensing element is 18 angstroms or more and 50 angstroms or less.

Here, a virtual boundary is set in a direction parallel to the interface between the above-described free magnetic layer and the above-described non-magnetic material layer in the film thickness of the free magnetic layer of the magnetic sensing element formed, a first region is assumed to be from the above-described virtual boundary to the above-described interface, and a second region is assumed to be the region from the above-described virtual boundary to a surface opposite to the above-described interface.

When the above-described free magnetic layer is formed as a laminate of the above-described first free magnetic layer and the above-described second free magnetic layer, the atomic percentage of the element Z in the above-described metal compound is decreased discontinuously from the above-described second region toward the first region in regions sandwiching the above-described virtual boundary.

Alternatively, when the above-described free magnetic layer is formed by a sputtering process in which the target is a metal compound represented by $(X_{0.67}Y_{0.33})_aZ_b$ (where a and b represent atomic percentages, and a+b=100 atomic percent) or XYZ, the atomic percentage of the element Z in the above-described metal compound is decreased discontinuously or continuously from the above-described second region toward the first region in regions sandwiching the above-described virtual boundary.

In the present invention, the atomic percentage of the element Z, which is at least one element of Al, Sn, In, Sb, Ga, Si, Ge, Pb, and Zn, among the constituent elements of the above-described metal compound constituting the above-described free magnetic layer and the above-described pinned magnetic layer is decreased in a region close to the above-described non-magnetic material layer. Consequently, the ferromagnetic coupling magnetic field $H_{in}$ due to the magnetostatic coupling (topological coupling) between the above-described free magnetic layer and the above-described pinned magnetic layer can be reduced.

Furthermore, in the above-described free magnetic layer or the above-described pinned magnetic layer, the atomic percentage of the above-described element Z is increased and a spin-dependent bulk scattering coefficient β is increased in a region at a distance from the above-described non-magnetic material layer, so that a product ΔRA of the amount of change ΔR in magnetic resistance and the element area A of the magnetic sensing element can be maintained at a high level.

As described above, the magnetic sensing element of the present invention allows a high reproduction output and reduction in asymmetry of reproduction waveform to become mutually compatible.

BRIEF DESCRIPTION OF THE DRAWINGS

FIG. 1 is a sectional view of the structure of a magnetic sensing element (single spin-valve type magnetoresistive element) according to a first embodiment of the present invention, viewed from the side of a surface facing a recording medium.

FIG. 2 is a sectional view of the structure of the magnetic sensing element (single spin-valve type magnetoresistive element) according to the first embodiment of the present invention, viewed from the side of the surface facing the recording medium.

FIG. 5 is a sectional view of the structure of a magnetic sensing element (single spin-valve type magnetoresistive element) according to a third embodiment of the present invention, viewed from the side of a surface facing a recording medium.

FIG. 6 is a sectional view of the structure of the magnetic sensing element (single spin-valve type magnetoresistive element) according to the third embodiment of the present invention, viewed from the side of the surface facing the recording medium.

DESCRIPTION OF THE PREFERRED EMBODIMENTS

Figure 3:
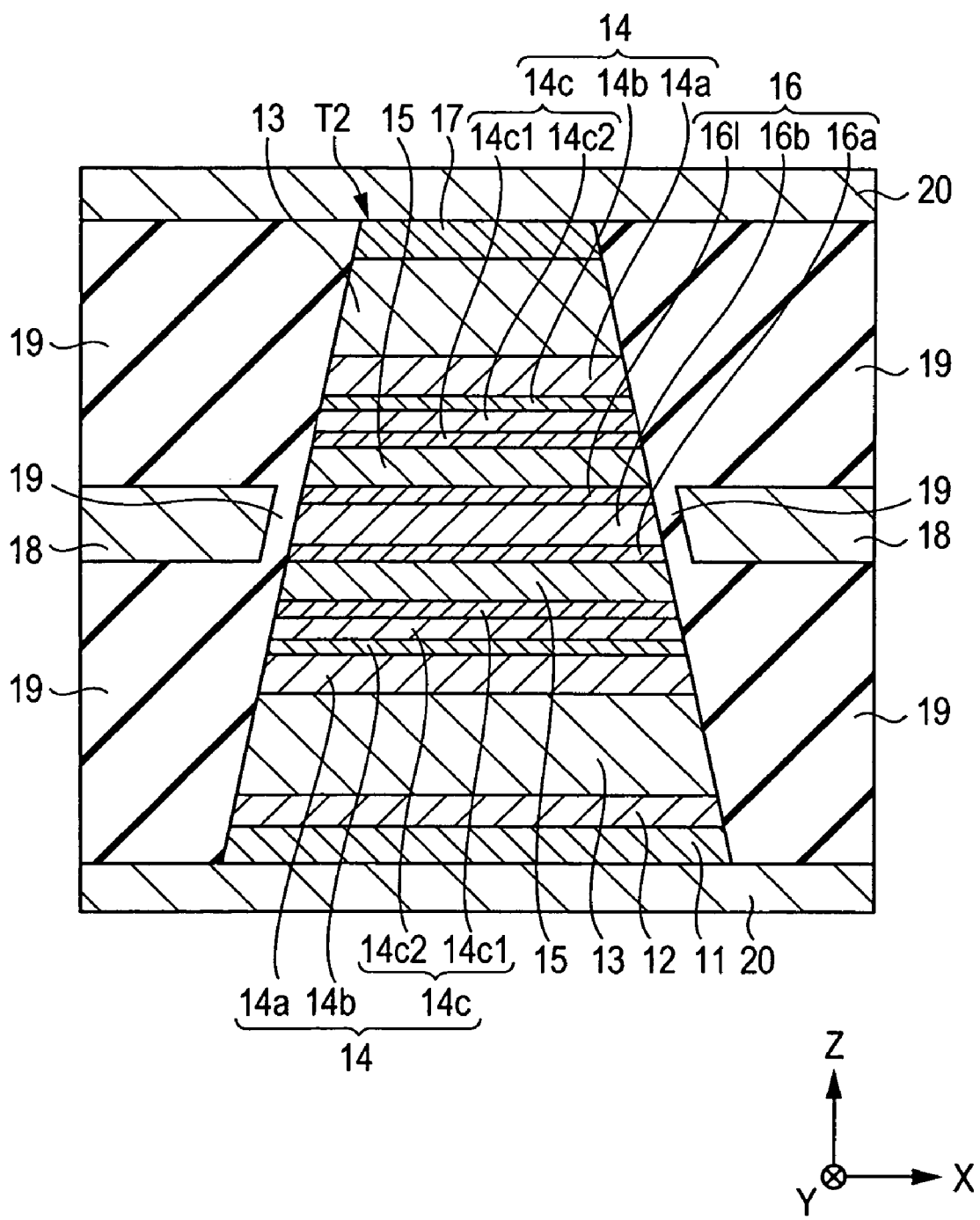
FIG. 3 is a sectional view of the structure of a magnetic sensing element (dual spin-valve type magnetoresistive element) according to a second embodiment of the present invention, viewed from the side of a surface facing a recording medium.

FIG. 1 and FIG. 2 are sectional views of the entire structure of a magnetic sensing element (single spin-valve type magnetoresistive element) according to an embodiment of the present invention, viewed from the side of a surface facing a recording medium. FIG. 1 and FIG. 2 are cutaway views of only a central portion of the element extending in the X direction. FIG. 1 shows the state before individual layers of the magnetic sensing element are subjected to a heat treatment after the film formation is conducted. FIG. 2 shows the state after the heat treatment is conducted.

This spin-valve type magnetoresistive element is disposed on, for example, a trailing side end portion of a flying slider disposed in a hard disk device, and detects a recording magnetic field of the hard disk and the like. The movement direction of the magnetic recording medium, e.g., a hard disk, is the Z direction, and the direction of a leakage magnetic field from the magnetic recording medium is the Y direction.

In FIG. 1, the lowermost layer is a substrate layer 11 formed from a non-magnetic material, e.g., at least one element of Ta, Hf, Nb, Zr, Ti, Mo, and W. A multilayer film T1 composed of a seed layer 12, an antiferromagnetic layer 13, a pinned magnetic layer 14, a non-magnetic material layer 15, a free magnetic layer 16, and a protective layer 17 is formed on this substrate layer 11 by a thin film formation process, e.g., a sputtering method or a evaporation method. The magnetic sensing element shown in FIG. 1 is a so-called bottom spin-valve type GMR magnetic sensing element in which the antiferromagnetic layer 13 is disposed under the free magnetic layer 16.

The seed layer 12 is formed from NiFeCr or Cr. When the seed layer 12 is formed from NiFeCr, the seed layer 12 takes on a face-centered cubic (fcc) structure, and equivalent crystal faces represented by a {111} face are preferentially oriented in a direction parallel to a film surface. When the seed layer is formed from Cr, the seed layer 12 takes on a body-centered cubic (bcc) structure, and equivalent crystal faces represented by a {110} face are preferentially oriented in a direction parallel to a film surface.

The substrate layer 11 takes on a structure close to an amorphous state. This substrate layer 11 may not be formed.

It is preferable that the antiferromagnetic layer 13 disposed on the above-described seed layer 12 is formed from an antiferromagnetic material containing an element X (where X is at least one element of Pt, Pd, Ir, Rh, Ru, and Os) and Mn.

The antiferromagnetic layer 13 takes on a face-centered cubic (fcc) structure or a face-centered tetragonal (fct) structure.

The X—Mn alloys including these platinum group elements have excellent properties suitable for antiferromagnetic materials. For example, the corrosion resistance is excellent, the blocking temperature is high, and the exchange coupling magnetic field (Hex) can be increased. In particular, it is preferable to use Pt among the platinum group elements. For example, PtMn alloys and IrMn alloys composed of binary system can be used.

In the present invention, the above-described antiferromagnetic layer 13 may be formed from an antiferromagnetic material containing the element X, an element X' (where the element X' is at least one element of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements), and Mn.

It is preferable that an element which enters a gap in a space lattice constructed by the element X and Mn or substitutes for a part of lattice points of a crystal lattice constructed by the element X and Mn is used as the above-described element X'. Here, a solid solution refers to a solid in which components are mixed homogeneously over a wide range.

When an interstitial solid solution or a substitutional solid solution is produced, the lattice constant of the above-described X—Mn—X' alloy can be made large as compared with the lattice constant of the above-described X—Mn alloy film. In this manner, the difference between the lattice constant of the antiferromagnetic layer 13 and the lattice constant of the pinned magnetic layer 14 can be increased, and the interface structure between the above-described antiferromagnetic layer 13 and the pinned magnetic layer 14 can easily be brought into a noncoherent state. Here, the noncoherent state refers to a state in which atoms constituting the above-described antiferromagnetic layer 13 and atoms constituting the above-described pinned magnetic layer 14 are not in a one-to-one correspondence at the interface between the above-described antiferromagnetic layer 13 and the pinned magnetic layer 14.

In particular, in the case where an element X', which results a substitutional solid solution, is used, if the compositional ratio of the above-described element X' becomes too large, the antiferromagnetic property is deteriorated, and an exchange coupling magnetic field generated at the interface to the pinned magnetic layer 14 is reduced. Particularly in the present invention, it is preferable that an interstitial solid solution is produced, and an inert gas, i.e. a noble gas element (at least one of Ne, Ar, Kr, and Xe) is used as the element X'. Since the noble gas is an inert gas, even when the noble gas element is contained in a film, the antiferromagnetic property is not influenced significantly. Furthermore, an Ar gas, for example, is a gas that is previously introduced as a sputtering gas into a sputtering apparatus and Ar can easily be entered into the film only by controlling the gas pressure appropriately.

In the case where a gaseous element is used as the element X', it is difficult to allow the film to contain large amounts of element X'. However, for the noble gas, even when a very small amount thereof is entered into the film, an exchange coupling magnetic field generated by a heat treatment can be increased dramatically.

In the present invention, a preferable composition range of the above-described element X' is 0.2 to 10 atomic percent, and more preferably is 0.5 to 5 atomic percent. In the present invention, it is preferable that the above-described element X is Pt. Therefore, it is preferable to use the Pt—Mn—X' alloy.

In the present invention, it is preferable to set the atomic percentage of the element X or the elements X+X' in the antiferromagnetic layer 13 at 45 atomic percent or more and 60 atomic percent or less, and more preferably at 49 atomic percent or more and 56.5 atomic percent or less. It is estimated that the interface to the pinned magnetic layer 14 is thereby brought into a noncoherent state in the film formation stage and, furthermore, appropriate order transformation of the above-described antiferromagnetic layer 13 is effected by a heat treatment.

The pinned magnetic layer 14 has a multilayer structure composed of a first pinned magnetic layer 14a, a non-magnetic intermediate layer 14b, and a second pinned magnetic layer 14c. The magnetization directions of the above-described first pinned magnetic layer 14a and the second pinned magnetic layer 14c are brought into a mutually antiparallel state by an exchange coupling magnetic field at the interface to the above-described antiferromagnetic layer 13 and an antiferromagnetic exchange coupling magnetic field (RKKY interaction) through the non-magnetic intermediate layer 14b. This is referred to as a so-called artificial ferrimagnetic coupling state. By this configuration, the magnetization of the pinned magnetic layer 14 can be brought into a stable state and, apparently, an exchange coupling magnetic field generated at the interface between the above-described pinned magnetic layer 14 and the antiferromagnetic layer 13 can be increased.

However, the above-described pinned magnetic layer 14 may be composed of the second pinned magnetic layer 14c alone and be in a state in which the artificial ferrimagnetic coupling state is not established.

The above-described first pinned magnetic layer 14a is formed to become, for example, about 15 to 35 angstroms, the non-magnetic intermediate layer 14b is formed to become about 8 to 10 angstroms, and the second pinned magnetic layer 14c is formed to become about 20 to 50 angstroms.

The first pinned magnetic layer 14a is formed from a ferromagnetic material, e.g., CoFe and NiFe. The non-magnetic intermediate layer 14b is formed from a non-magnetic conductive material, e.g., Ru, Rh, Ir, Cr, Re, and Cu.

The film of the second pinned magnetic layer 14c is formed taking on a two-layer structure composed of a first layer 14c1 (first layer of the pinned magnetic layer) in contact with the non-magnetic material layer 15 and a second layer 14c2 (second layer of the pinned magnetic layer). The second pinned magnetic layer 14c is a feature portion of the magnetic sensing element of the present embodiment and, therefore, will be described below in detail.

The non-magnetic material layer 15 disposed on the above-described pinned magnetic layer 14 is formed from Cu, Au, or Ag. The non-magnetic material layer 15 formed from Cu, Au, or Ag has a face-centered cubic (fcc) structure, and equivalent crystal faces represented by a {111} face are preferentially oriented in a direction parallel to a film surface.

Furthermore, the free magnetic layer 16 is disposed. The film of the free magnetic layer 16 is also formed taking on a two-layer structure composed of a first layer 16a (first layer of the free magnetic layer) in contact with the non-magnetic material layer 15 and a second layer 16b (second layer of the free magnetic layer). The free magnetic layer 16 is a feature portion of the magnetic sensing element of the present embodiment and, therefore, will be described below in detail.

In the embodiment shown in FIG. 1, hard bias layers 18 and 18 are disposed on both sides of the free magnetic layer 16. The magnetization of the free magnetic layer 16 is aligned in a track-width direction (X direction shown in the drawing) by longitudinal bias magnetic fields from the above-described hard bias layers 18 and 18. The hard bias layers 18 and 18 are formed from, for example, a cobalt-platinum (Co—Pt) alloy or a cobalt-chromium-platinum (Co—Cr—Pt) alloy.

The top, the bottom, and the end portions of the hard bias layers 18 and 18 are insulated by insulating layers 19 and 19.

Electrode layers 20 and 20 are disposed on and under the multilayer film T1. Therefore, a CPP (current perpendicular to the plane)-GMR type magnetic sensing element is constructed, in which a sensing current is passed in a direction perpendicular to film surfaces of the individual layers constituting the multilayer film T1.

The electrode layers 20 and 20 are formed from α-Ta, Au, Cr, Cu (copper), Rh, Ir, Ru, or W (tungsten).

For the spin-valve type thin film element shown in FIG. 1, after the substrate layer 11 to the protective layer 17 are laminated, a heat treatment is conducted and, thereby, an exchange coupling magnetic field is generated at the interface between the above-described antiferromagnetic layer 13 and the pinned magnetic layer 14. At this time, the magnetic field is directed toward a direction parallel to the Y direction shown in the drawing. In this manner, the magnetization of the above-described pinned magnetic layer 14 is directed toward a direction parallel to the Y direction shown in the drawing and is pinned. In the embodiment shown in FIG. 1, since the above-described pinned magnetic layer 14 has a laminated ferrimagnetic structure, when the first pinned magnetic layer 14a is magnetized in, for example, the Y direction shown in the drawing, the second pinned magnetic layer 14c is magnetized in a direction opposite to the Y direction shown in the drawing.

In the magnetic sensing element shown in FIG. 1, the magnetization of the pinned magnetic layer and the magnetization of the free magnetic layer are in the relationship of being orthogonal to each other. The leakage magnetic field from a recording medium enters the magnetic sensing element in the Y direction shown in the drawing, and the magnetization of the free magnetic layer is varied with high sensitivity. The electrical resistance is changed based on the relationship between this variation in the magnetization direction and the pinned magnetization direction of the pinned magnetic layer, and the leakage magnetic field from the recording medium is detected based on the change in voltage or the change in current resulting from this change in the value of electrical resistance.

The feature portions of the magnetic sensing element of the present embodiment will be described.

In the magnetic sensing element in the state shown in FIG. 1, the film of the second pinned magnetic layer 14c is disposed as a laminate of the first layer 14c1 (first layer of the pinned magnetic layer) in contact with the non-magnetic material layer 15 and the second layer 14c2 (second layer of the pinned magnetic layer) stacked on the first layer 14c1. The first layer 14c1 and the second layer 14c2 of the second pinned magnetic layer 14c are formed from metal compounds represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent), and the atomic percentage of the element Z in the metal compound constituting the first layer 14c1 is smaller than the atomic percentage of the element Z in the metal compound constituting the second layer 14c2.

The film of the free magnetic layer 16 is disposed as a laminate of the first free layer 16a (first layer of the free magnetic layer) in contact with the non-magnetic material layer 15 and the second free layer 16b (second layer of the free magnetic layer) stacked on the first layer 16a. The first layer 16a and the second layer 16b of the free magnetic layer 16 are also formed from metal compounds represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent), and the atomic percentage of the element Z in the metal compound constituting the first layer 16a is smaller than the atomic percentage of the element Z in the metal compound constituting the second layer 16b.

In the metal compound represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent), X is at least one element of Cu, Co, Ni, Rh, Pt, Au, Pd, Ir, Ru, Ag, Zn, Cd, and Fe, Y is at least one element of Mn, Fe, Ti, V, Zr, Nb, Hf, Ta, Cr, Co, and Ni, and Z is at least one element of Al, Sn, In, Sb, Ga, Si, Ge, Pb, and Zn.

That is, for the magnetic sensing element of the present embodiment, the atomic percentages of the element Z can be decreased in regions close to the non-magnetic material layer 15 in the inside of the second pinned magnetic layer 14c and the free magnetic layer 16. Consequently, the diffusion of the element Z into the non-magnetic material layer 15 is suppressed, and the ferromagnetic coupling magnetic field $H_{in}$ due to the magnetostatic coupling (topological coupling) between the free magnetic layer 16 and the pinned magnetic layer 14 can be reduced.

Furthermore, in the inside of the second pinned magnetic layer 14c and the free magnetic layer 16, the atomic percentages of the above-described element Z are increased and spin-dependent bulk scattering coefficients β are increased in regions at a distance from the non-magnetic material layer 15, so that a product ΔRA of the amount of change ΔR in magnetic resistance and the element area A of the magnetic sensing element can be maintained at a high level.

Preferably, the atomic percentages of the element Z in the second layer 14c2 of the second pinned magnetic layer 14c and the second layer 16b of the free magnetic layer 16 are specified to be more than 24 atomic percent and 26 atomic percent or less. When the atomic percentage of the element Z is more than 24 atomic percent and 26 atomic percent or less, the above-described metal compound tends to take on an $L_{21}$ type crystal structure, and the spin-dependent bulk scattering coefficients β of the second layer 14c2 of the second pinned magnetic layer 14c and the free magnetic layer 16 are increased. That is, the spin dependence of conductive electrons of the second layer 14c2 of the second pinned magnetic layer 14c and the free magnetic layer 16 is increased. Therefore, the product ΔRA of the amount of change ΔR in magnetic resistance and the element area A of the magnetic sensing element can be increased.

In order to reduce the ferromagnetic coupling magnetic field $H_{in}$ due to the magnetostatic coupling (topological coupling) between the second pinned magnetic layer 14c and the free magnetic layer 16, it is preferable that the atomic percentages of the element Z in the first layer 16a of the free magnetic layer 16 and the first layer 14c1 of the second pinned magnetic layer 14c are specified to be 19 atomic percent or more and 24 atomic percent or less. More preferable ranges of the atomic percentages of the element Z in the first layer 16a of the free magnetic layer 16 and the first layer 14c1 of the second pinned magnetic layer 14c are 22 atomic percent or less.

Furthermore, in order to allow a high reproduction output and reduction in asymmetry of reproduction waveform of the magnetic sensing element to become mutually compatible, preferably, the difference between the atomic percentage of the element Z in the first layer 16a of the free magnetic layer 16 and the atomic percentage of the element Z in the second layer 16b is specified to be 3 atomic percent or more. In addition, preferably, the difference between the atomic percentage of the element Z in the first layer 14c1 of the second pinned magnetic layer 14c and the atomic percentage of the element Z in the second layer 14c2 is specified to be 3 atomic percent or more.

Preferably, the metal compounds to form the second pinned magnetic layer 14c and the free magnetic layer 16 are the following compounds represented by respective compositional formulae.

1. A metal compound represented by a compositional formula of $(Co_{0.67}Y_{0.33})_aZ_b$ (where a and b represent atomic percentages, and a+b=100 atomic percent), wherein the above-described Y is at least one element of Mn, Fe, and Cr, and the above-described Z is at least one element of Al, Ga, Si, and Ge.

2. A metal compound represented by a compositional formula of $(Co_{0.67}Mn_{0.33})_aZ_b$ (where a and b represent atomic percentages, and a+b=100 atomic percent), wherein the above-described Z is Si or Ge.

3. A metal compound represented by a compositional formula of $(Co_{0.67}Mn_{0.33})_aGe_b$ (where a and b represent atomic percentages, and a+b=100 atomic percent).

Preferably, the film thickness of the first layer 16a of the free magnetic layer 16 is 2 angstroms or more and 15 angstroms or less. Preferably, the film thickness of the second layer 16b is 30 angstroms or more and 80 angstroms or less. Preferably, the film thickness of the first layer 14c1 of the second pinned magnetic layer 14c is 2 angstroms or more and 15 angstroms or less. Preferably, the film thickness of the second layer 14c2 is 20 angstroms or more and 50 angstroms or less. Preferably, the film thickness of the non-magnetic material layer 15 is 18 angstroms or more and 50 angstroms or less.

As described above, after the substrate layer 11 to the protective layer 17 are laminated, a heat treatment is conducted and, thereby, an exchange coupling magnetic field is generated at the interface between the above-described antiferromagnetic layer 13 and the pinned magnetic layer 14. FIG. 2 is a sectional view showing the state of the magnetic sensing element after the heat treatment is conducted. The above-described metal compounds constituting the free magnetic layer 16 and the pinned magnetic layer 14 are also ordered by this heat treatment. At the same time, elements in the first layer 16a of the free magnetic layer 16 and elements in the second layer 16b are mutually diffused, and elements in the first layer 14c1 of the second pinned magnetic layer 14c and elements in the second layer 14c2 are also mutually diffused.

However, the elements in the first layer 16a of the free magnetic layer 16 and the elements in the second layer 16b are not completely diffused to become a homogeneous composition. Likewise, the elements in the first layer 14c1 of the second pinned magnetic layer 14c and the elements in the second layer 14c2 do not become a completely homogeneous composition.

A virtual boundary A is set at the location which is the interface between the first layer 16a of the free magnetic layer 16 and the second layer 16b in FIG. 1. This virtual boundary is a plane parallel to the interface between the free magnetic layer 16 and the non-magnetic material layer 15. When a first region 16c is assumed to be from the virtual boundary A to the interface between the free magnetic layer 16 and the non-magnetic material layer 15, and a second region 16d is assumed to be the region from the virtual boundary A to a top surface 16e (a surface opposite to the interface between the free magnetic layer 16 and the non-magnetic material layer 15) of the free magnetic layer 16, the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) is decreased continuously or discontinuously from the second region 16d toward the first region 16c in regions sandwiching the virtual boundary A.

When the difference between the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the first layer 16a of the free magnetic layer 16 and the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the second layer 16b is large, the atomic percentage of the element Z is decreased discontinuously from the second region 16d toward the first region 16c. On the other hand, when the difference between the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the first layer 16a of the free magnetic layer 16 and the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the second layer 16b is small, the atomic percentage of the element Z is decreased continuously from the second region 16d toward the first region 16c.

Furthermore, a virtual boundary B is set at the location which is the interface between the first layer 14c1 and the second layer 14c2 of the second pinned magnetic layer 14c in FIG. 1. This virtual boundary B is a plane parallel to the interface between the second pinned magnetic layer 14c and the non-magnetic material layer 15. When a first region 14c3 is assumed to be from the virtual boundary B to the interface between the second pinned magnetic layer 14c and the non-magnetic material layer 15, and a second region 14c4 is assumed to be the region from the virtual boundary B to a bottom surface 14d (a surface opposite to the interface between the second pinned magnetic layer 14c and the non-magnetic material layer 15) of the second pinned magnetic layer 14c, the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) is decreased continuously or discontinuously from the second region 14c4 toward the first region 14c3 in regions sandwiching the virtual boundary B.

When the difference between the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the first layer 14c1 of the second pinned magnetic layer 14c and the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the second layer 14c2 is large, the atomic percentage of the element Z is decreased discontinuously from the second region 14c4 toward the first region 14c3. On the other hand, when the difference between the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the first layer 14c1 of the second pinned magnetic layer 14c and the value of the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) in the second layer 14c2 is small, the atomic percentage of the element Z is decreased continuously from the second region 14c4 toward the first region 14c3.

In the above-described embodiment, the film of the free magnetic layer 16 is formed taking on a two-layer structure composed of the first layer 16a and the second layer 16b, the film of the second pinned magnetic layer 14c is formed taking on a two-layer structure composed of the first layer 14c1 and the second layer 14c2 and, thereafter, the heat treatment is conducted so as to form the magnetic sensing element.

However, the free magnetic layer 16 may be formed by a sputtering process in which the target is the above-described metal compound represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) and the film formation of the free magnetic layer 16 at this time may be conducted in such a way that the atomic percentage of the element Z in the above-described metal compound is decreased with increasing proximity to the non-magnetic material layer 15 side. That is, the atomic percentage of the element Z in the above-described metal compound is increased with increasing proximity to the top surface 16e of the free magnetic layer 16. In addition, the second pinned magnetic layer 14c may be formed by a sputtering process in which the target is the above-described metal compound represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) and the film formation of the second pinned magnetic layer 14c at this time may be conducted in such a way that the atomic percentage of the element Z in the above-described metal compound is decreased with increasing proximity to the non-magnetic material layer 15 side.

In the magnetic sensing element shown in FIG. 2, preferably, the atomic percentages of the element Z in the metal compounds in the neighborhood of the center 16f of the free magnetic layer 16 and in the neighborhood of the center 14e of the second pinned magnetic layer 14c are more than 24 atomic percent and 26 atomic percent or less.

When the atomic percentage of the element Z in the metal compound is more than 24 atomic percent and 26 atomic percent or less, the metal compound tends to take on an $L_{21}$ type crystal structure, and the spin-dependent bulk scattering coefficients β of the free magnetic layer 16 and the second pinned magnetic layer 14c are increased. That is, the spin dependence of conductive electrons passing the free magnetic layer 16 and the second pinned magnetic layer 14c is increased. Therefore, the product ΔRA of the amount of change ΔR in magnetic resistance and the element area A of the magnetic sensing element can be increased.

In order to reduce the ferromagnetic coupling magnetic field $H_{in}$ due to the magnetostatic coupling (topological coupling) between the free magnetic layer 16 and the second pinned magnetic layer 14c, it is preferable that the atomic percentage of the element Z in the metal compound in the neighborhood of the interface of the free magnetic layer 16 or the second pinned magnetic layer 14c to the non-magnetic material layer is 19 atomic percent or more and 24 atomic percent or less. The more preferable range of the atomic percentage of the element Z in the metal compound in the neighborhood of the interface of the free magnetic layer 16 or the second pinned magnetic layer 14c to the non-magnetic material layer is 22 atomic percent or less.

Furthermore, in order to allow a high reproduction output and reduction in asymmetry of reproduction waveform of the magnetic sensing element to become mutually compatible, preferably, the difference between the atomic percentage of the element Z in the metal compound in the neighborhood of the center 16f of the free magnetic layer 16 and the atomic percentage of the element Z in the metal compound in the neighborhood of the interface between the free magnetic layer 16 and the non-magnetic material layer is specified to be 3 atomic percent or more. In addition, the difference between the atomic percentage of the element Z in the metal compound in the neighborhood of the center 14e of the second pinned magnetic layer 14c and the atomic percentage of the element Z in the metal compound in the neighborhood of the interface between the second pinned magnetic layer 14c and the non-magnetic material layer is specified to be 3 atomic percent or more.

FIG. 3 is a partial sectional view of the structure of a dual spin-valve type magnetic sensing element of the present invention.

As shown in FIG. 3, a substrate layer 11, a seed layer 12, an antiferromagnetic layer 13, a pinned magnetic layer 14, a non-magnetic material layer 15, a free magnetic layer 16 are laminated sequentially from the bottom. Furthermore, a non-magnetic material layer 15, a pinned magnetic layer 14, an antiferromagnetic layer 13, and a protective layer 17 are laminated sequentially on the free magnetic layer 16, so that a multilayer film T2 is disposed.

Hard bias layers 18 and 18 are laminated on both sides of the free magnetic layer 16. The hard bias layers 18 and 18 are insulated by insulating layers 19 and 19 made of alumina or the like.

Electrode layers 20 and 20 are disposed on and under the multilayer film T2. Therefore, a CPP (current perpendicular to the plane)-GMR type magnetic sensing element is constructed, in which a sensing current is passed in a direction perpendicular to film surfaces of the individual layers constituting the multilayer film T2.

The layer shown in FIG. 3 and the layer shown in FIG. 1 indicated by the same reference numeral are formed from the same material.

For the spin-valve type thin film element shown in FIG. 3, after the substrate layer 11 to the protective layer 17 are laminated, a heat treatment is conducted and, thereby, an exchange coupling magnetic field is generated at the interface between the above-described antiferromagnetic layer 13 and the pinned magnetic layer 14. At this time, the magnetic field is directed toward a direction parallel to the Y direction shown in the drawing. In this manner, the magnetization of the above-described pinned magnetic layer 14 is directed toward a direction parallel to the Y direction shown in the drawing and is pinned. In the embodiment shown in FIG. 3, since the above-described pinned magnetic layer 14 has a laminated ferrimagnetic structure, when the first pinned magnetic layer 14a is magnetized in, for example, the Y direction shown in the drawing, the second pinned magnetic layer 14c is magnetized in a direction opposite to the Y direction shown in the drawing.

In the magnetic sensing element shown in FIG. 3, the magnetization of the pinned magnetic layer and the magnetization of the free magnetic layer are in the relationship of being orthogonal to each other. The leakage magnetic field from a recording medium enters the magnetic sensing element in the Y direction shown in the drawing, and the magnetization of the free magnetic layer is varied with high sensitivity. The electrical resistance is changed based on the relationship between this variation in the magnetization direction and the pinned magnetization direction of the pinned magnetic layer, and the leakage magnetic field from the recording medium is detected based on the change in voltage or the change in current resulting from this change in the value of electrical resistance.

The feature portions of the magnetic sensing element of the present embodiment will be described.

In the magnetic sensing element in the state shown in FIG. 3, the film of the second pinned magnetic layer 14c is formed as a laminate of a first layer 14c1 (first layer of the pinned magnetic layer) in contact with the non-magnetic material layer 15 and a second layer 14c2 (second layer of the pinned magnetic layer) stacked on the first layer 14c1. The first layer 14c1 and the second layer 14c2 of the second pinned magnetic layer 14c are formed from metal compounds represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent), and the atomic percentage of the element Z in the metal compound constituting the first layer 14c1 is smaller than the atomic percentage of the element Z in the metal compound constituting the second layer 14c2.

The film of the free magnetic layer 16 is formed as a laminate of a first free layer 16a (first layer of the free magnetic layer) in contact with the lower non-magnetic material layer 15, a second free layer 16b (second layer of the free magnetic layer) stacked on the first layer 16a, and a third layer 161 (third layer of the free magnetic layer) in contact with the upper non-magnetic material layer 15. The first layer 16a, the second layer 16b, and the third layer 161 of the free magnetic layer 16 are also formed from metal compounds represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent), and the atomic percentages of the element Z in the metal compounds constituting the first layer 16a and the third layer 161 are smaller than the atomic percentage of the element Z in the metal compound constituting the second layer 16b.

In the metal compound represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent), X is at least one element of Cu, Co, Ni, Rh, Pt, Au, Pd, Ir, Ru, Ag, Zn, Cd, and Fe, Y is at least one element of Mn, Fe, Ti, V, Zr, Nb, Hf, Ta, Cr, Co, and Ni, and Z is at least one element of Al, Sn, In, Sb, Ga, Si, Ge, Pb, and Zn.

That is, for the magnetic sensing element of the present embodiment, the atomic percentages of the element Z can be decreased in regions close to the non-magnetic material layers 15 in the inside of the second pinned magnetic layers 14c and the free magnetic layer 16. Consequently, the diffusion of the element Z into the non-magnetic material layers 15 is suppressed, and the ferromagnetic coupling magnetic fields $H_{in}$ due to the magnetostatic coupling (topological coupling) between the free magnetic layer 16 and the pinned magnetic layers 14 and 14 can be reduced.

Furthermore, in the inside of the second pinned magnetic layers 14c and the free magnetic layer 16, the atomic percentages of the above-described element Z are increased and spin-dependent bulk scattering coefficients β are increased in regions at a distance from the non-magnetic material layers 15, so that a product ΔRA of the amount of change ΔR in magnetic resistance and the element area A of the magnetic sensing element can be maintained at a high level.

Preferably, the atomic percentage of the element Z in the second layer 14c2 of the second pinned magnetic layer 14c and the second layer 16b of the free magnetic layer 16 are specified to be more than 24 atomic percent and 26 atomic percent or less. When the atomic percentage of the element Z is more than 24 atomic percent and 26 atomic percent or less, the above-described metal compound tends to take on an $L_{21}$ type crystal structure, and the spin-dependent bulk scattering coefficients β of the second pinned magnetic layer 14c and the free magnetic layer 16 are increased. That is, the spin dependence of conductive electrons of the second layer 14c2 of the second pinned magnetic layer 14c and that of the second layer 16b of the free magnetic layer 16 are increased. Therefore, the product ΔRA of the amount of change ΔR in magnetic resistance and the element area A of the magnetic sensing element can be increased.

In order to reduce the ferromagnetic coupling magnetic field $H_{in}$ due to the magnetostatic coupling (topological coupling) between the second pinned magnetic layer 14c and the free magnetic layer 16, it is preferable that the atomic percentages of the element Z in the first layer 16a and the third layer 16l of the free magnetic layer 16 and the first layer 14c1 of the second pinned magnetic layer 14c are specified to be 19 atomic percent or more and 24 atomic percent or less. More preferable ranges of the atomic percentages of the element Z in the first layer 16a and the third layer 16l of the free magnetic layer 16 and the first layer 14c1 of the second pinned magnetic layer 14c are 22 atomic percent or less.

Furthermore, in order to allow a high reproduction output and reduction in asymmetry of reproduction waveform of the magnetic sensing element to become mutually compatible, preferably, the differences between the atomic percentage of the element Z in the first layer 16a of the free magnetic layer 16 and the atomic percentage of the element Z in the second layer 16b and between the atomic percentage of the element Z in the third layer 16l and the atomic percentage of the element Z in the second layer 16b are specified to be 3 atomic percent or more. In addition, preferably, the difference between the atomic percentage of the element Z in the first layer 14c1 of the second pinned magnetic layer 14c and the atomic percentage of the element Z in the second layer 14c2 is specified to be 3 atomic percent or more.

Preferably, the metal compounds to form the second pinned magnetic layer 14c and the free magnetic layer 16 are the following compounds represented by respective compositional formulae.

1. A metal compound represented by a compositional formula of $(Co_{0.67}Y_{0.33})_a Z_b$ (where a and b represent atomic percentages, and a+b=100 atomic percent), wherein the above-described Y is at least one element of Mn, Fe, and Cr, and the above-described Z is at least one element of Al, Ga, Si, and Ge.

2. A metal compound represented by a compositional formula of $(Co_{0.67}Mn_{0.33})_a Z_b$ (where a and b represent atomic percentages, and a+b=100 atomic percent), wherein the above-described Z is Si or Ge.

3. A metal compound represented by a compositional formula of $(Co_{0.67}Mn_{0.33})_a Ge_b$ (where a and b represent atomic percentages, and a+b=100 atomic percent).

Preferably, the film thicknesses of the first layer 16a and the third layer 16l of the free magnetic layer 16 are 2 angstroms or more and 15 angstroms or less. Preferably, the film thickness of the second layer 16b is 30 angstroms or more and 80 angstroms or less. Preferably, the film thickness of the first layer 14c1 of the second pinned magnetic layer 14c is 2 angstroms or more and 15 angstroms or less. Preferably, the film thickness of the second layer 14c2 is 20 angstroms or more and 50 angstroms or less. Preferably, the film thickness of the non-magnetic material layer 15 is 18 angstroms or more and 50 angstroms or less.

Figure 4:
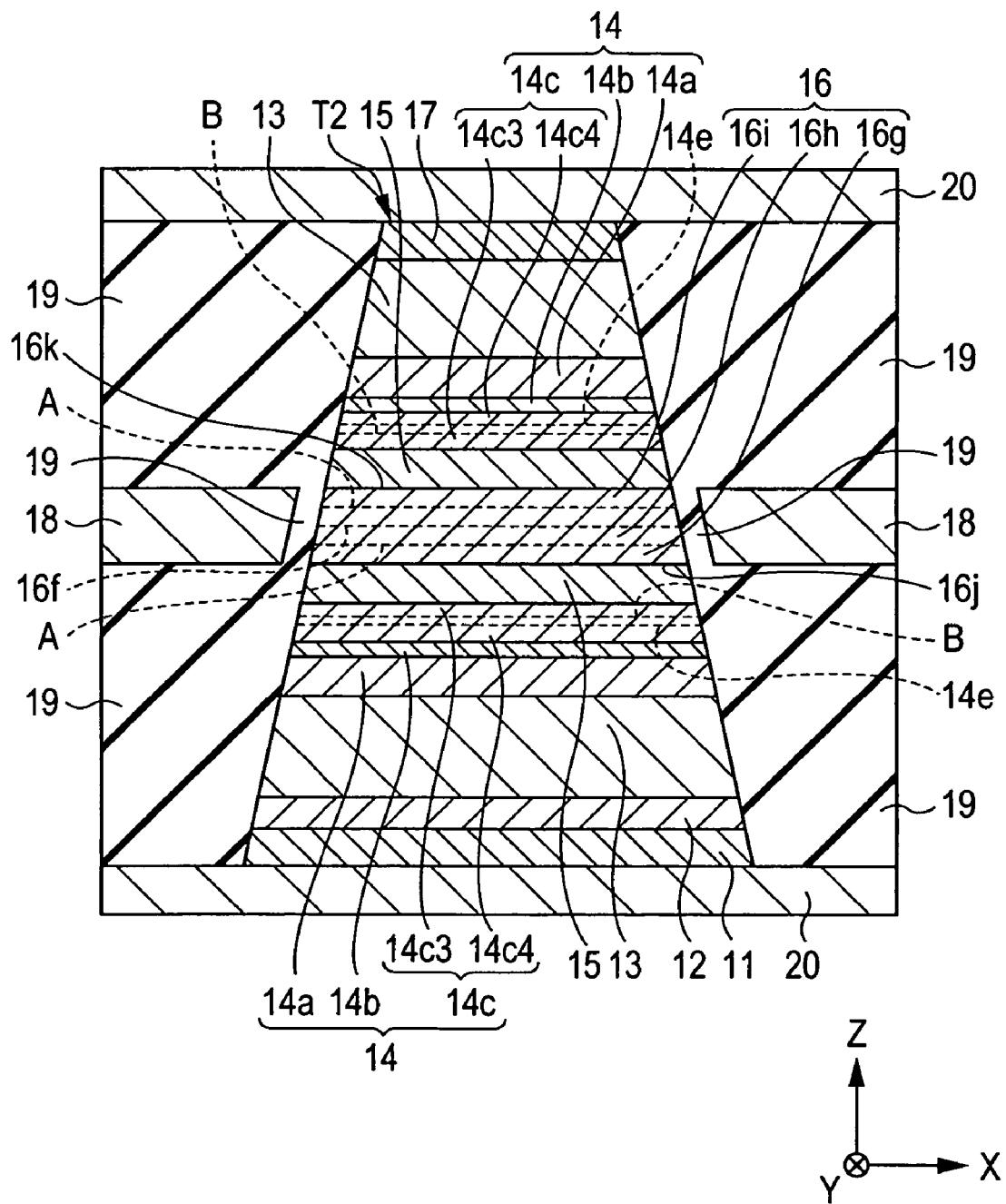
FIG. 4 is a sectional view of the structure of the magnetic sensing element (dual spin-valve type magnetoresistive element) according to the second embodiment of the present invention, viewed from the side of the surface facing the recording medium.

As described above, after the substrate layer 11 to the protective layer 17 are laminated, a heat treatment is conducted and, thereby, an exchange coupling magnetic field is generated at the interface between the above-described antiferromagnetic layer 13 and the pinned magnetic layer 14. FIG. 4 is a sectional view showing the state of the magnetic sensing element after the heat treatment is conducted. The metal compounds constituting the free magnetic layer 16 and the pinned magnetic layer 14 are also ordered by this heat treatment. At the same time, elements in the first layer 16a and the third layer 16l of the free magnetic layer 16 and elements in the second layer 16b are mutually diffused, and elements in the first layer 14c1 of the second pinned magnetic layer 14c and elements in the second layer 14c2 are also mutually diffused.

However, the elements in the first layer 16a and the third layer 16l of the free magnetic layer 16 and the elements in the second layer 16b are not completely diffused to become a homogeneous composition. Likewise, the elements in the first layer 14c1 of the second pinned magnetic layer 14c and the elements in the second layer 14c2 do not become a completely homogeneous composition.

Virtual boundaries A are set at the locations which are the interfaces between the first layer 16a of the free magnetic layer 16 and the second layer 16b and between the third layer 16l of the free magnetic layer 16 and the second layer 16b in FIG. 3. These virtual boundaries are planes parallel to the interface between the free magnetic layer 16 and the non-magnetic material layer 15. A first region 16g is assumed to be from the lower virtual boundary A to the interface between the free magnetic layer 16 and the lower non-magnetic material layer 15, a second region 16h is assumed to be the region from the lower virtual boundary A to the upper virtual boundary A, and a third region 16i is assumed to be the region from the upper virtual boundary A to the interface between the free magnetic layer 16 and the upper non-magnetic material layer 15. Consequently, the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) is decreased continuously or discontinuously from the second region 16h toward the first region 16g in regions sandwiching the lower virtual boundary A. Furthermore, the atomic percentage of the element Z in the metal compound $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent) is decreased continuously or discontinuously from the second region 16h toward the third region 16i in regions sandwiching the upper virtual boundary A.

When the difference between the values of the atomic percentages of the element Z in the metal compounds $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the first layer 16a and the third layer 161 of the free magnetic layer 16 and the value of the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the second layer 16b are large, the atomic percentage of the element Z is decreased discontinuously from the second region 16h toward the first region 16g, and the atomic percentage of the element Z is decreased discontinuously from the second region 16h toward the third region 16i. On the other hand, when the difference between the values of the atomic percentages of the element Z in the metal compounds $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the first layer 16a and the third layer 161 of the free magnetic layer 16 and the value of the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the second layer 16b are small, the atomic percentage of the element Z is decreased continuously from the second region 16h toward the first region 16g, and the atomic percentage of the element Z is decreased continuously from the second region 16h toward the third region 16i.

Furthermore, virtual boundaries B are set at the locations which are the interfaces between the first layers 14c1 of the second pinned magnetic layers 14c and the second layers 14c2 in FIG. 3. These virtual boundaries B are planes parallel to the interface between the second pinned magnetic layer 14c and the non-magnetic material layer 15. When first regions 14c3 are assumed to be from the virtual boundaries B to the interfaces between the second pinned magnetic layers 14c and the non-magnetic material layers 15, and second regions 14c4 are assumed to be the region from the virtual boundaries B to the interfaces between the second pinned magnetic layers 14c and the non-magnetic intermediate layers 14b (surfaces opposite to the interfaces between the second pinned magnetic layers 14c and the non-magnetic material layers 15), the atomic percentages of the element Z in the metal compounds $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) are decreased continuously or discontinuously from the second regions 14c4 toward the first regions 14c3 in regions sandwiching the virtual boundaries B.

When the difference between the value of the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the first layer 14c1 of the second pinned magnetic layer 14c and the value of the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the second layer 14c2 is large, the atomic percentage of the element Z is decreased discontinuously from the second region 14c4 toward the first region 14c3. On the other hand, when the difference between the value of the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the first layer 14c1 of the second pinned magnetic layer 14c and the value of the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the second layer 14c2 is small, the atomic percentage of the element Z is decreased continuously from the second region 14c4 toward the first region 14c3.

In the above-described embodiment, the film of the free magnetic layer 16 is formed taking on a three-layer structure composed of the first layer 16a, the third layer 161, and the second layer 16b, the film of the second pinned magnetic layer 14c is formed taking on a two-layer structure composed of the first layer 14c1 and the second layer 14c2 and, thereafter, the heat treatment is conducted so as to form the magnetic sensing element.

However, the free magnetic layer 16 may be formed by a sputtering process in which the target is the above-described metal compound represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) and the film formation of the free magnetic layer 16 at this time may be conducted in such a way that the atomic percentage of the element Z in the above-described metal compound is decreased with increasing proximity to the non-magnetic material layer 15 side. That is, the atomic percentage of the element Z in the above-described metal compound is decreased with increasing proximity to the top surface of the free magnetic layer 16.

In addition, the second pinned magnetic layer 14c may be formed by a sputtering process in which the target is the above-described metal compound represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) and the film formation of the second pinned magnetic layer 14c at this time may be conducted in such a way that the atomic percentage of the element Z in the above-described metal compound is decreased with increasing proximity to the non-magnetic material layer 15 side.

In the magnetic sensing element shown in FIG. 4, preferably, the atomic percentages of the element Z in the metal compounds in the neighborhood of the center 16f of the free magnetic layer 16 and in the neighborhood of the center 14e of the second pinned magnetic layer 14c are more than 24 atomic percent and 26 atomic percent or less.

When the atomic percentage of the element Z in the metal compound is more than 24 atomic percent and 26 atomic percent or less, the metal compound tends to take on an $L_{21}$ type crystal structure, and the spin-dependent bulk scattering coefficients β of the free magnetic layer 16 and the second pinned magnetic layer 14c are increased. That is, the spin dependence of conductive electrons passing the free magnetic layer 16 and the second pinned magnetic layer 14c is increased. Therefore, the product ΔRA of the amount of change ΔR in magnetic resistance and the element area A of the magnetic sensing element can be increased.

In order to reduce the ferromagnetic coupling magnetic field $H_{in}$ due to the magnetostatic coupling (topological coupling) between the free magnetic layer 16 and the second pinned magnetic layer 14c, it is preferable that the atomic percentage of the element Z in the metal compound in the neighborhood of the interface of the free magnetic layer 16 or the second pinned magnetic layer 14c to the non-magnetic material layer 15 is 19 atomic percent or more and 24 atomic percent or less. A more preferable range of the atomic percentage of the element Z in the metal compound in the neighborhood of the interface of the free magnetic layer 16 or the second pinned magnetic layer 14c to the non-magnetic material layer 15 is 22 atomic percent or less.

Furthermore, in order to allow a high reproduction output and reduction in asymmetry of reproduction waveform of the magnetic sensing element to become mutually compatible, preferably, the difference between the atomic percentage of the element Z in the metal compound in the neighborhood of the center 16f of the free magnetic layer 16 and the atomic percentage of the element Z in the metal compound in the neighborhood of the interface between the free magnetic layer 16 and the non-magnetic material layer 15 is specified to be 3 atomic percent or more. In addition, the difference between the atomic percentage of the element Z in the metal compound in the neighborhood of the center 14e of the second pinned magnetic layer 14c and the atomic percentage of the element Z in the metal compound in the neighborhood of the interface between the second pinned magnetic layer 14c and the non-magnetic material layer 15 is specified to be 3 atomic percent or more.

FIG. 5 is a partial sectional view showing the structure of a top spin-valve type magnetic sensing element of the present invention.

As shown in FIG. 5, a substrate layer 11, a seed layer 12, a free magnetic layer 16, a non-magnetic material layer 15, a pinned magnetic layer 14, an antiferromagnetic layer 13, and a protective layer 17 are laminated sequentially from the bottom, so that a multilayer film T5 is disposed.

Hard bias layers 18 and 18 are laminated on both sides of the free magnetic layer 16. The hard bias layers 18 and 18 are insulated by insulating layers 19 and 19 made of alumina or the like.

Electrode layers 20 and 20 are disposed on and under the multilayer film T5. Therefore, a CPP (current perpendicular to the plane)-GMR type magnetic sensing element is constructed, in which a sensing current is passed in a direction perpendicular to film surfaces of the individual layers constituting the multilayer film T5.

The layers shown in FIG. 5 and the layers shown in FIG. 1 indicated by the same reference numerals are formed from the same materials.

For the spin-valve type thin film element shown in FIG. 5, after the substrate layer 11 to the protective layer 17 are laminated, a heat treatment is conducted and, thereby, an exchange coupling magnetic field is generated at the interface between the above-described antiferromagnetic layer 13 and the pinned magnetic layer 14. At this time, the magnetic field is directed toward a direction parallel to the Y direction shown in the drawing. In this manner, the magnetization of the above-described pinned magnetic layer 14 is directed toward a direction parallel to the Y direction shown in the drawing and is pinned. In the embodiment shown in FIG. 5, since the above-described pinned magnetic layer 14 has a laminated ferrimagnetic structure, when the first pinned magnetic layer 14a is magnetized in, for example, the Y direction shown in the drawing, the second pinned magnetic layer is are magnetized in a direction opposite to the Y direction shown in the drawing.

In the magnetic sensing element shown in FIG. 5, the magnetization of the pinned magnetic layer and the magnetization of the free magnetic layer are in the relationship of being orthogonal to each other. The leakage magnetic field from a recording medium enters the magnetic sensing element in the Y direction shown in the drawing, and the magnetization of the free magnetic layer is varied with high sensitivity. The electrical resistance is changed based on the relationship between this variation in the magnetization direction and the pinned magnetization direction of the pinned magnetic layer, and the leakage magnetic field from the recording medium is detected based on the change in voltage or the change in current resulting from this change in the value of electrical resistance.

In the magnetic sensing element in the state shown in FIG. 5 as well, the first layer 14c1 and the second layer 14c2 of the pinned magnetic layer 14c are formed from metal compounds represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent), and the atomic percentage of the element Z in the metal compound constituting the first layer 14c1 is smaller than the atomic percentage of the element Z in the metal compound constituting the second layer 14c2.

The first layer 16a and the second layer 16b of the free magnetic layer 16 are also formed from metal compounds represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent), and the atomic percentage of the element Z in the metal compound constituting the first layer 16a is smaller than the atomic percentage of the element Z in the metal compound constituting the second layer 16b.

In the metal compound represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent), X is at least one element of Cu, Co, Ni, Rh, Pt, Au, Pd, Ir, Ru, Ag, Zn, Cd, and Fe, Y is at least one element of Mn, Fe, Ti, V, Zr, Nb, Hf, Ta, Cr, Co, and Ni, and Z is at least one element of Al, Sn, In, Sb, Ga, Si, Ge, Pb, and Zn.

That is, for the magnetic sensing element of the present embodiment, the atomic percentage of the element Z can be decreased in regions close to the non-magnetic material layer 15 in the inside of the second pinned magnetic layer 14c and the free magnetic layer 16. Consequently, the diffusion of the element Z into the non-magnetic material layer 15 is suppressed, and the ferromagnetic coupling magnetic field $H_{in}$ due to the magnetostatic coupling (topological coupling) between the free magnetic layer 16 and the pinned magnetic layer 14 can be reduced.

Furthermore, in the inside of the second pinned magnetic layer 14c and the free magnetic layer 16, the atomic percentages of the above-described element Z are increased and spin-dependent bulk scattering coefficients β are increased in regions at a distance from the non-magnetic material layer 15, so that a product ΔRA of the amount of change ΔR in magnetic resistance and the element area A of the magnetic sensing element can be maintained at a high level.

After the substrate layer 11 to the protective layer 17 are laminated, a heat treatment is conducted and, thereby, an exchange coupling magnetic field is generated at the interface between the above-described antiferromagnetic layer 13 and the pinned magnetic layer 14. FIG. 6 is a sectional view showing the state of the magnetic sensing element after the heat treatment is conducted.

A virtual boundary A is set at the location which is the interface between the first layer 16a of the free magnetic layer 16 and the second layer 16b in FIG. 5. This virtual boundary is a plane parallel to the interface between the free magnetic layer 16 and the non-magnetic material layer 15. When a first region 16c is assumed to be from the virtual boundary A to the interface between the free magnetic layer 16 and the non-magnetic material layer 15, and a second region 16d is assumed to be the region from the virtual boundary A to a bottom surface (a surface opposite to the interface between the free magnetic layer 16 and the non-magnetic material layer 15) of the free magnetic layer 16, the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) is decreased continuously or discontinuously from the second region 16d toward the first region 16c in regions sandwiching the virtual boundary A.

Furthermore, a virtual boundary B is set at the location which is the interface between the first layer 14c1 and the second layer 14c2 of the second pinned magnetic layer 14c in FIG. 5. This virtual boundary B is a plane parallel to the interface between the second pinned magnetic layer 14c and the non-magnetic material layer 15. When a first region 14c3 is assumed to be from the virtual boundary B to the interface between the second pinned magnetic layer 14c and the non-magnetic material layer 15, and a second region 14c4 is assumed to be the region from the virtual boundary B to a top surface (a surface opposite to the interface between the second pinned magnetic layer 14c and the non-magnetic material layer 15) of the second pinned magnetic layer 14c, the atomic percentage of the element Z in the metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) is decreased continuously or discontinuously from the second region 14c4 toward the first region 14c3 in regions sandwiching the virtual boundary B.

The free magnetic layer 16 may be formed by a sputtering process in which the target is the above-described metal compound represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) and the film formation of the free magnetic layer 16 at this time may be conducted in such a way that the atomic percentage of the element Z in the above-described metal compound is decreased with increasing proximity to the non-magnetic material layer 15 side. Alternatively, the second pinned magnetic layer 14c may be formed by a sputtering process in which the target is the above-described metal compound represented by $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) and the film formation of the second pinned magnetic layer 14c at this time may be conducted in such a way that the atomic percentage of the element Z in the above-described metal compound is decreased with increasing proximity to the non-magnetic material layer 15 side.

The preferable values of the atomic percentages of the element Z in the metal compounds $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) in the inside of the free magnetic layer 16 and the second pinned magnetic layer 14c are similar to the values of the magnetic sensing element of the embodiment shown in FIG. 1 and FIG. 2. Likewise, the preferable values of film thicknesses of individual layers or individual regions in the inside of the free magnetic layer 16 and the second pinned magnetic layer 14c are similar to the values of the magnetic sensing element of the embodiment shown in FIG. 1 and FIG. 2.

For the magnetic sensing elements of the embodiments shown in FIG. 1 to FIG. 6, the atomic percentages of the element Z in the metal compounds $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent) of all the free magnetic layers 16 and the second pinned magnetic layers 14c are modulated. However, in the present invention, it is essential only that at least one of the free magnetic layer and the pinned magnetic layer constituting the magnetic sensing element is formed from the above-described metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent), and the atomic percentage of the element Z in this metal compound is decreased on the non-magnetic material layer side. Even when a plurality of free magnetic layers or a plurality of pinned magnetic layers are present, it is essential only that at least one layer is formed from the above-described metal compound $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent), and the atomic percentage of the element Z in this metal compound is decreased on the non-magnetic material layer side.

EXAMPLE 1

Film formation of a dual spin-valve type magnetic sensing element having a laminated structure described below was conducted, and the ferromagnetic coupling magnetic field $H_{in}$ between a free magnetic layer and a pinned magnetic layer and the product ΔRA of the amount of change ΔR in magnetic resistance and the element area A of the magnetic sensing element were measured when the atomic percentage of Ge in a $(Co_{0.67}Mn_{0.33})_aGe_b$ alloy (where a and b represent atomic percentages, and a+b=100 atomic percent) serving as a material for the free magnetic layer was changed.

Substrate/substrate layer Ta (30 angstroms)/seed layer NiFeCr (50 angstroms)/antiferromagnetic layer IrMn (70 angstroms)/first pinned magnetic layer $Co_{70}Fe_{30}$/non-magnetic intermediate layer Ru (9.1 angstroms)/second pinned magnetic layer ($Co_{60}Fe_{40}$ (10 angstroms)/$Co_2MnGe$ alloy layer (40 angstroms))/non-magnetic material layer Cu (43 angstroms)/free magnetic layer (($Co_{0.67}Mn_{0.33})_aGe_b$ (where a and b represent atomic percentages, and a+b=100 atomic percent) (80 angstroms))/non-magnetic material layer Cu (43 angstroms)/second pinned magnetic layer ($Co_2MnGe$ alloy layer (40 angstroms)/$Co_{60}Fe_{40}$ (10 angstroms)/non-magnetic intermediate layer Ru (9.1 angstroms)/first pinned magnetic layer $Co_{60}Fe_{40}$)/antiferromagnetic layer IrMn (70 angstroms)/protective layer Ta (200 angstroms)

Figure 7:
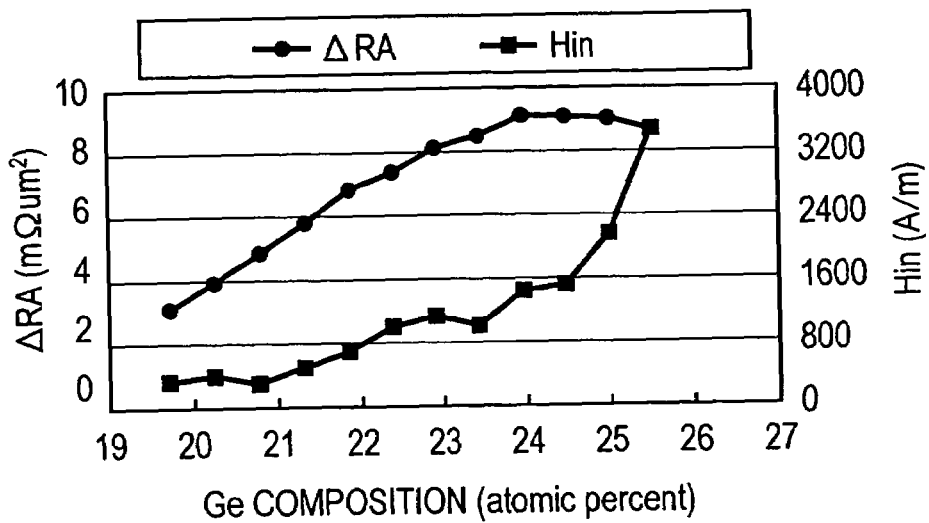
FIG. 7 is a graph showing the results of measurements of the ferromagnetic coupling magnetic field $H_{in}$ between a free magnetic layer and a pinned magnetic layer and the product $\Delta RA$ of the amount of change $\Delta R$ in magnetic resistance and the element area A of a magnetic sensing element when film formation of a dual spin-valve type magnetoresistive element is conducted and the atomic percentages of Ge in the materials for the free magnetic layer and the pinned magnetic layer are changed.

FIG. 7 is a graph showing the results. As is clear from FIG. 7, the ΔRA of the magnetic sensing element is increased and the ferromagnetic coupling magnetic field $H_{in}$ between the free magnetic layer and the pinned magnetic layer is also increased with increasing Ge content in the $(Co_{0.67}Mn_{0.33})_aGe_b$ alloy (where a and b represent atomic percentages, and a+b=100 atomic percent) of the free magnetic layer.

When the Ge content in the $(Co_{0.67}Mn_{0.33})_aGe_b$ alloy (where a and b represent atomic percentages, and a+b=100 atomic percent) is about 25 atomic percent, the $(Co_{0.67}Mn_{0.33})_aGe_b$ alloy (where a and b represent atomic percentages, and a+b=100 atomic percent) takes predominantly on an $L_{2_1}$ type Heusler crystal structure. Therefore, the magnetic sensing element exhibits a maximum ΔRA when the Ge content in the $(Co_{0.67}Mn_{0.33})_aGe_b$ alloy (where a and b represent atomic percentages, and a+b=100 atomic percent) is 24 atomic percent to 26 atomic percent.

The ferromagnetic coupling magnetic field $H_{in}$ between the free magnetic layer and the pinned magnetic layer is sharply decreased when the Ge content in the $(Co_{0.67}Mn_{0.33})_aGe_b$ alloy (where a and b represent atomic percentages, and a+b=100 atomic percent) becomes 24 atomic percent or less.

As is clear from these results, the ferromagnetic coupling magnetic field $H_{in}$ between the free magnetic layer and the pinned magnetic layer can be reduced while the ΔRA of the magnetic sensing element is maintained at a high level by specifying the Ge content in the $(Co_{0.67}Mn_{0.33})_aGe_b$ alloy (where a and b represent atomic percentages, and a+b=100 atomic percent) to be 24 atomic percent or less in the neighborhood of the interface of the free magnetic layer and specifying the Ge content in the $(Co_{0.67}Mn_{0.33})_aGe_b$ alloy (where a and b represent atomic percentages, and a+b=100 atomic percent) to be more than 24 atomic percent, for example, 26 atomic percent, in the neighborhood of the central portion of the free magnetic layer.

Consequently, it is preferable that the atomic percentage of the element Z in the above-described metal compound Co—Mn-Z in the neighborhood of the central portion of the free magnetic layer is within the range of 25 atomic percent to 26 atomic percent, and it is preferable that the atomic percentage of the element Z in the above-described metal compound Co—Mn-Z in the neighborhood of the interface of the free magnetic layer to the above-described non-magnetic material layer is 19 atomic percent or more and 24 atomic percent or less.

Subsequently, a magnetic sensing element including a free magnetic layer having a three-layer structure, in which $(Co_{0.67}Mn_{0.33})_aGe_b$ (where a and b represent atomic percentages, and a+b=100 atomic percent) alloy layers (upper layer, lower layer) containing Ge within the range of 19 atomic percent to 24 atomic percent were laminated on and under a $Co_2MnGe$ alloy layer (middle layer) containing 25 atomic percent of Ge, was formed. That is, it was attempted to increase the ΔRA of the magnetic sensing element by specifying the Ge content in the $Co_2MnGe$ alloy to be about 25 atomic percent in the central portion of the free magnetic layer and, at the same time, to reduce the ferromagnetic coupling magnetic field $H_{in}$ between the free magnetic layer and the pinned magnetic layer by specifying the Ge content in the $(Co_{0.67}Mn_{0.33})_aGe_b$ alloy (where a and b represent atomic percentages, and a+b=100 atomic percent) to be about 19 atomic percent to 24 atomic percent in the neighborhood of the interface between the free magnetic layer and the non-magnetic material layer.

The film configuration of the magnetic sensing element used for the experiment will be described below. Substrate/ substrate layer Ta (30 angstroms)/seed layer NiFeCr (50 angstroms)/antiferromagnetic layer IrMn (70 angstroms)/first pinned magnetic layer $Co_{70}Fe_{30}$/non-magnetic intermediate layer Ru (9.1 angstroms)/second pinned magnetic layer ($Co_{60}Fe_{40}$ (10 angstroms)/$Co_2MnGe$ alloy layer (40 angstroms))/non-magnetic material layer Cu (43 angstroms)/free magnetic layer (lower layer (($Co_{0.67}Mn_{0.33})_aGe_b$ (where a and b represent atomic percentages, a+b=100 atomic percent, and 19 atomic percent≦b≦24 atomic percent) (10 angstroms))/middle layer (($Co_2MnGe$) (60 angstroms))/upper layer (($Co_{0.67}Mn_{0.33})_aGe_b$ (where a and b represent atomic percentages, a+b=100 atomic percent, and 19 atomic percent≦b≦24 atomic percent) (10 angstroms)))/non-magnetic material layer Cu (43 angstroms)/second pinned magnetic layer ($Co_2MnGe$ alloy layer (40 angstroms)/$Co_{60}Fe_{40}$ (10 angstroms)/non-magnetic intermediate layer Ru (9.1 angstroms)/first pinned magnetic layer $Co_{60}Fe_{40}$/antiferromagnetic layer IrMn (70 angstroms)/protective layer Ta (200 angstroms)

Figure 8:
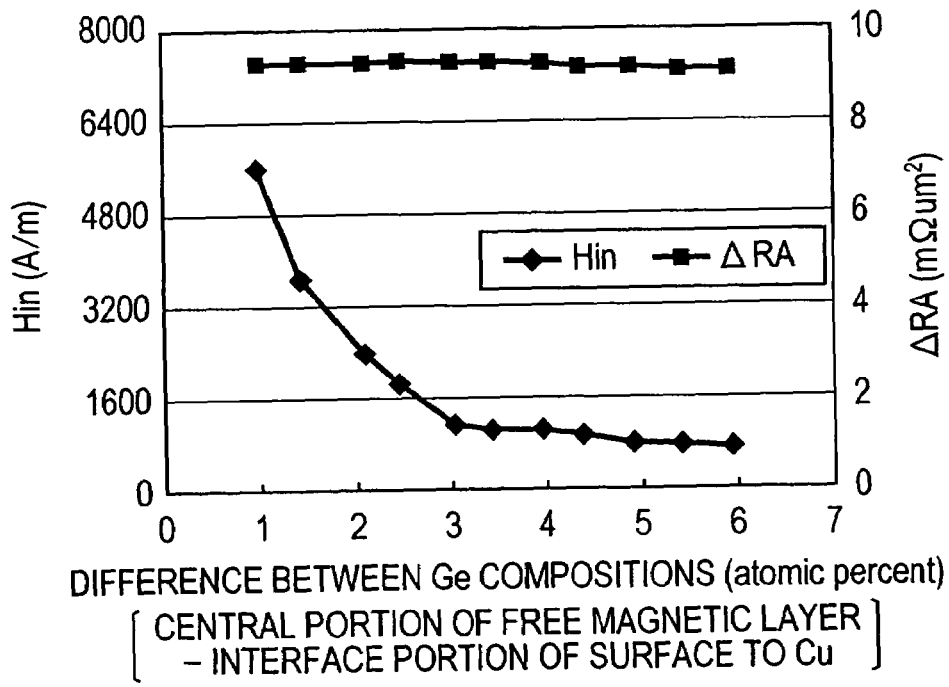
FIG. 8 is a graph showing the results of measurements of the ferromagnetic coupling magnetic field $H_{in}$ between a free magnetic layer and a pinned magnetic layer and the product $\Delta RA$ of the amount of change $\Delta R$ in magnetic resistance and the element area A of a magnetic sensing element when the magnetic sensing element is formed including the free magnetic layer having a three-layer structure in which Co—Mn—Ge alloy layers (an upper layer and a lower layer) containing Ge in the range of 19 atomic percent to 24 atomic percent are laminated on and under a $Co_2MnGe$ alloy layer (a middle layer) containing 25 atomic percent of Ge.
Figure 9:
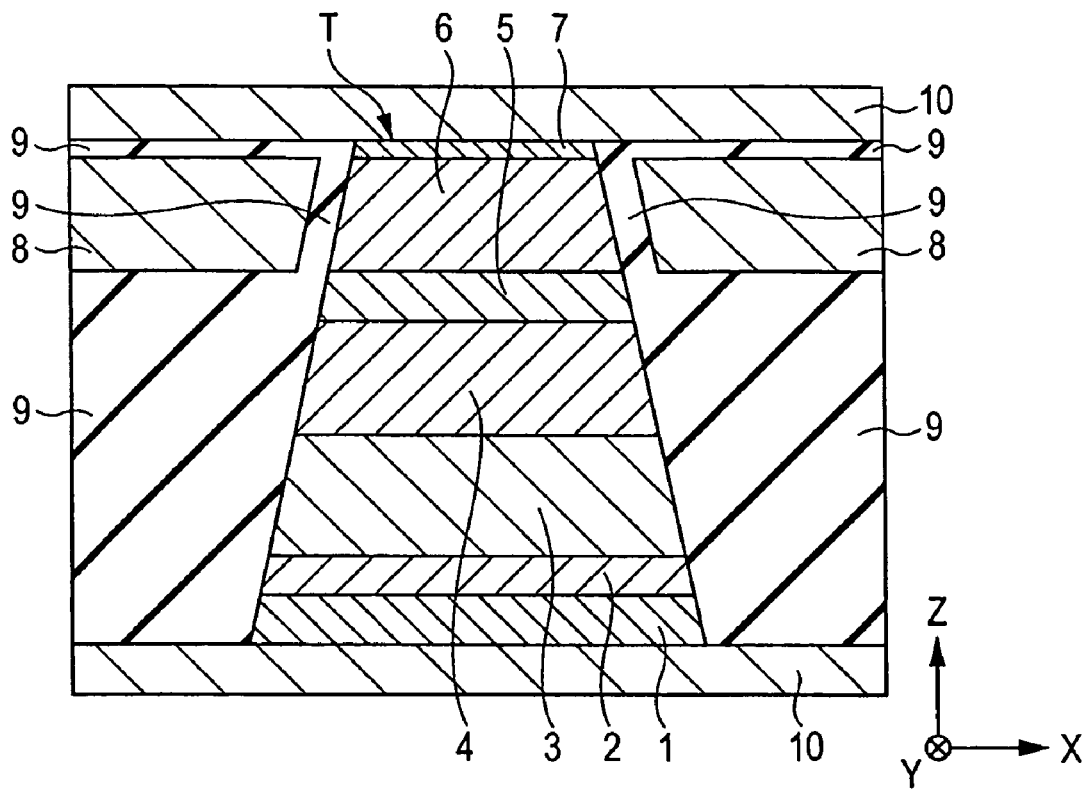
FIG. 9 is a sectional view of the structure of a known magnetic sensing element (single spin-valve type magnetoresistive element), viewed from the side of a surface facing a recording medium.
Figure 10:
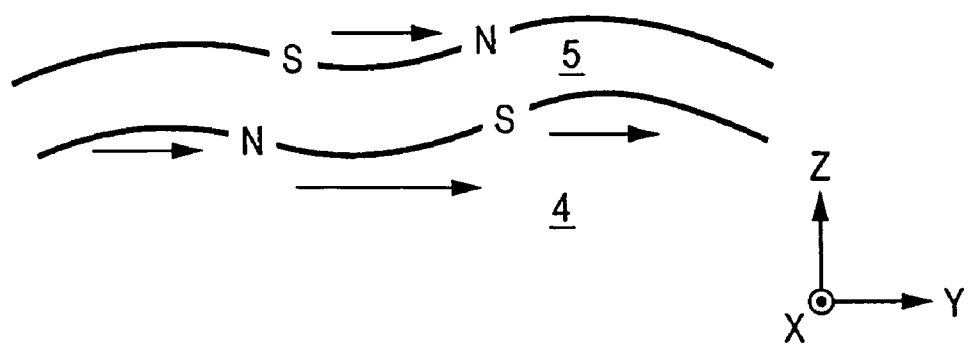
FIG. 10 is a magnified partial sectional view of the magnetic sensing element shown in FIG. 9.

FIG. 8 is a graph showing the results. The horizontal axis indicates the difference between the Ge content (25 atomic percent) in the $Co_2MnGe$ alloy of the middle layer of the free magnetic layer and the Ge content in $(Co_{0.67}Mn_{0.33})_aGe_b$ (where a and b represent atomic percentages, a+b=100 atomic percent, and 19 atomic percent≦b≦24 atomic percent) of the upper layer and the lower layer. The Ge contents of the Co—Mn—Ge alloys of the upper layer and the lower layer of the free magnetic layer are equal.

As is clear from the graph shown in FIG. 8, the ferromagnetic coupling magnetic field $H_{in}$ between the free magnetic layer and the pinned magnetic layer is reduced sharply and becomes 1,200 A/m or less when the difference in Ge contents between the middle layer of the free magnetic layer and the upper layer and the lower layer becomes 3 atomic percent or more. On the other hand, the ΔRA of the magnetic sensing element is not changed even when the difference in Ge contents between the middle layer of the free magnetic layer and the upper layer and the lower layer is increased from 1 atomic percent to 6 atomic percent.

From these results, in the present invention, preferably, the difference between the atomic percentage of the element Z in the above-described metal compound Co—Mn-Z in the neighborhood of the center of the free magnetic layer and the atomic percentage of the element Z in the above-described metal compound Co—Mn-Z in the neighborhood of the interface of the above-described free magnetic layer to the above-described non-magnetic material layer is specified to be 3 atomic percent or more.

Furthermore, it is clear that the atomic percentage of the element Z in the above-described metal compound Co—Mn-Z in the neighborhood of the center of the free magnetic layer is preferably within the range of 25 atomic percent to 26 atomic percent, and the atomic percentage of the element Z in the above-described metal compound Co—Mn-Z in the neighborhood of the interface of the free magnetic layer to the above-described non-magnetic material layer is 19 atomic percent or more and 22 atomic percent or less.

In the above-described Example, the ΔRA of the magnetic sensing element was increased by specifying the Ge content in the $Co_2MnGe$ alloy to be about 25 atomic percent in the central portion of the free magnetic layer and, at the same time, the ferromagnetic coupling magnetic field $H_{in}$ between the free magnetic layer and the pinned magnetic layer was reduced by specifying the Ge content in the $Co_2MnGe$ alloy to be about 19 atomic percent to 24 atomic percent in the neighborhood of the interface between the free magnetic layer and the non-magnetic material layer.

Likewise, in order to effect the composition modulation of the pinned magnetic layer and reduce the ferromagnetic coupling magnetic field $H_{in}$ between the free magnetic layer and the pinned magnetic layer while the ΔRA of the magnetic sensing element is maintained at a high level, it is recommended that the Z content in the $(Co_{0.67}Mn_{0.33})_aZ_b$ alloy (where a and b represent atomic percentages, and a+b=100 atomic percent) is specified to be within the range of 25 atomic percent to 26 atomic percent in the neighborhood of the central portion of the pinned magnetic layer, and the Z content in the $(Co_{0.67}Mn_{0.33})_aZ_b$ alloy (where a and b represent atomic percentages, and a+b=100 atomic percent) is specified to be within the range of 19 atomic percent to 24 atomic percent in the neighborhood of the interface between the pinned magnetic layer and the non-magnetic material layer. It is more preferable that the Z content in the $(Co_{0.67}Mn_{0.33})_aZ_b$ alloy (where a and b represent atomic percentages, and a+b=100 atomic percent) is specified to be within the range of 19 atomic percent to 22 atomic percent in the neighborhood of the interface between the pinned magnetic layer and the non-magnetic material layer.

Furthermore, it is preferable that the difference between the atomic percentage of the element Z in the above-described metal compound Co—Mn-Z in the neighborhood of the center of the pinned magnetic layer and the atomic percentage of the element Z in the above-described metal compound Co—Mn-Z in the neighborhood of the interface of the above-described pinned magnetic layer to the above-described non-magnetic material layer is specified to be 3 atomic percent or more.

What is claimed is:

1. A magnetic sensing element including a pinned magnetic layer, in which the magnetization direction is pinned in one direction, and a free magnetic layer disposed on the pinned magnetic layer with a non-magnetic material layer therebetween, the magnetic sensing element characterized in that:
the free magnetic layer includes a layer made of a metal compound represented by a compositional formula of $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent); and
a region, in which the atomic percentage of the element Z in the metal compound is decreased with increasing proximity to the non-magnetic material layer side, is present in the free magnetic layer,
wherein the X is at least one element of Cu, Co, Ni, Rh, Pt, Au, Pd, Ir, Ru, Ag, Zn, Cd, and Fe, the Y is at least one element of Mn, Fe, Ti, V, Zr, Nb, Hf, Ta, Cr, Co, and Ni, and the Z is at least one element of Al, Sn, In, Sb, Ga, Si, Ge, Pb, and Zn.

2. The magnetic sensing element according to claim 1, wherein when a virtual boundary is set in a direction parallel to the interface between the free magnetic layer and the non-magnetic material layer in the film thickness of the free magnetic layer, a first region is assumed to be from the virtual boundary to the interface, and a second region is assumed to be the region from the virtual boundary to a surface opposite to the interface, the atomic percentage of the element Z in the metal compound is decreased continuously or discontinuously from the second region toward the first region in regions sandwiching the virtual boundary.

3. The magnetic sensing element according to claim 1, wherein the atomic percentage of the element Z in the metal compound in the neighborhood of the center of the free magnetic layer or the pinned magnetic layer is more than 24 atomic percent and 26 atomic percent or less.

4. The magnetic sensing element according to claim 1, wherein the atomic percentage of the element Z in the metal compound in the neighborhood of the interface of the free magnetic layer or the pinned magnetic layer to the non-magnetic material layer is 19 atomic percent or more and 24 atomic percent or less.

5. The magnetic sensing element according to claim 4, wherein the atomic percentage of the element Z in the metal compound in the neighborhood of the interface of the free magnetic layer or the pinned magnetic layer to the non-magnetic material layer is 22 atomic percent or less.

6. The magnetic sensing element according to claim 1, wherein the difference between the atomic percentage of the element Z in the metal compound in the neighborhood of the center of the free magnetic layer or the pinned magnetic layer and the atomic percentage of the element Z in the metal compound in the neighborhood of the interface of the free magnetic layer or the pinned magnetic layer to the non-magnetic material layer is 3 atomic percent or more.

7. The magnetic sensing element according to claim 1, in which the metal compound is formed from a metal compound represented by a compositional formula of $(Co_{0.67}Y_{0.33})_aZ_b$ (where a and b represent atomic percentages, and a+b=100 atomic percent),
wherein the Y is at least one element of Mn, Fe, and Cr, and the Z is at least one element of Al, Ga, Si, and Ge.

8. The magnetic sensing element according to claim 7, in which the metal compound is formed from a metal compound represented by a compositional formula of $(Co_{0.67}Mn_{0.33})_aZ_b$ (where a and b represent atomic percentages, and a+b=100 atomic percent),
wherein the Z is Si or Ge.

9. The magnetic sensing element according to claim 8, in which the metal compound is formed from a metal compound represented by a compositional formula of $(Co_{0.67}Mn_{0.33})_a Ge_b$ (where a and b represent atomic percentages, and a+b=100 atomic percent).

10. The magnetic sensing element according to claim 1, wherein the film thickness of the non-magnetic material layer is 18 angstroms or more and 50 angstroms or less.

11. The magnetic sensing element according to claim 1, comprising an antiferromagnetic layer, the pinned magnetic layer which is disposed in contact with the antiferromagnetic layer and in which the magnetization direction is pinned by an exchange anisotropic magnetic field with the antiferromagnetic layer, and the free magnetic layer disposed on the pinned magnetic layer with the non-magnetic material layer therebetween.

12. The magnetic sensing element according to claim 1, comprising non-magnetic material layers laminated on and under the free magnetic layer, and pinned magnetic layers located on one of the non-magnetic material layers and under the other non-magnetic material layer.

13. The magnetic sensing element according to claim 12, comprising antiferromagnetic layers which are located on one of the pinned magnetic layers and under the other pinned magnetic layer and which pin the magnetization directions of the respective pinned magnetic layers in constant directions by exchange anisotropic magnetic fields.

14. The magnetic sensing element according to claim 1, wherein a sensing current is passed in a direction perpendicular to film surfaces of the pinned magnetic layer, the non-magnetic material layer, and the free magnetic layer.

15. A magnetic sensing element including a pinned magnetic layer, in which the magnetization direction is pinned in one direction, and a free magnetic layer disposed on the pinned magnetic layer with a non-magnetic material layer therebetween, the magnetic sensing element characterized in that:
the pinned magnetic layer includes a layer made of a metal compound represented by a compositional formula of $(X_{0.67}Y_{0.33})_aZ_b$ (where a and b represent atomic percentages, and a+b=100 atomic percent) or $X_dY_eZ_f$ (where d, e, and f represent atomic percentages, and d+e+f=100 atomic percent); and
a region, in which the atomic percentage of the element Z in the metal compound is decreased with increasing proximity to the non-magnetic material layer side, is present in the pinned magnetic layer, wherein the X is at least one element of Cu, Co, Ni, Rh, Pt, Au, Pd, Ir, Ru, Ag, Zn, Cd, and Fe, the Y is at least one element of Mn, Fe, Ti, V, Zr, Nb, Hf, Ta, Cr, Co, and Ni, and the Z is at least one element of Al, Sn, In, Sb, Ga, Si, Ge, Pb, and Zn.

16. The magnetic sensing element according to claim 15, wherein when a virtual boundary is set in a direction parallel to the interface between the pinned magnetic layer and the non-magnetic material layer in the film thickness of the pinned magnetic layer, a first region is assumed to be from the virtual boundary to the interface, and a second region is assumed to be the region from the virtual boundary to a surface opposite to the interface, the atomic percentage of the element Z in the metal compound is decreased continuously or discontinuously from the second region toward the first region in regions sandwiching the virtual boundary.

17. A method for manufacturing a magnetic sensing element including a pinned magnetic layer, in which the magnetization direction is pinned in one direction, and a free magnetic layer disposed on the pinned magnetic layer with a non-magnetic material layer therebetween, the method characterized by comprising the steps of:

forming the free magnetic layer as a laminate of a first free magnetic layer in contact with the non-magnetic material layer and a second free magnetic layer stacked on the first free magnetic layer;

forming the first free magnetic layer and the second free magnetic layer from metal compounds represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and specifying the atomic percentage of the element Z in the metal compound constituting the first free magnetic layer to be smaller than the atomic percentage of the element Z in the metal compound constituting the second free magnetic layer, wherein the X is at least one element of Cu, Co, Ni, Rh, Pt, Au, Pd, Ir, Ru, Ag, Zn, Cd, and Fe, the Y is at least one element of Mn, Fe, Ti, V, Zr, Nb, Hf, Ta, Cr, Co, and Ni, and the Z is at least one element of Al, Sn, In, Sb, Ga, Si, Ge, Pb, and Zn.

18. The method for manufacturing a magnetic sensing element according to claim 17, wherein the atomic percentage of the element Z in the metal compound of the second free magnetic layer is specified to be more than 24 atomic percent and 26 atomic percent or less.

19. The method for manufacturing a magnetic sensing element according to claim 17, wherein the atomic percentage of the element Z in the metal compound of the first free magnetic layer is specified to be 19 atomic percent or more and 24 atomic percent or less.

20. The method for manufacturing a magnetic sensing element according to claim 19, wherein the atomic percentage of the element Z in the metal compound of the first free magnetic layer is specified to be 22 atomic percent or less.

21. The method for manufacturing a magnetic sensing element according to claim 17, wherein the difference between the atomic percentage of the element Z in the metal compound of the second free magnetic layer and the atomic percentage of the element Z in the metal compound of the first free magnetic layer is specified to be 3 atomic percent or more.

22. The method for manufacturing a magnetic sensing element according to claim 17, wherein the metal compound is formed from a metal compound represented by a compositional formula of $(Co_{0.67}Y_{0.33})_a Z_b$ (where a and b represent atomic percentages, and a+b=100 atomic percent), wherein the Y is at least one element of Mn, Fe, and Cr, and the Z is at least one element of Al, Ga, Si, and Ge.

23. The method for manufacturing a magnetic sensing element according to claim 22, wherein the metal compound is formed from a metal compound represented by a compositional formula of $(Co_{0.67}Y_{0.33})_a Z_b$ (where a and b represent atomic percentages, and a+b=100 atomic percent), wherein the Z is Si or Ge.

24. The method for manufacturing a magnetic sensing element according to claim 23, wherein the metal compound is formed from a metal compound represented by a compositional formula of $(Co_{0.67}Mn_{0.33})_a Ge_b$ (where a and b represent atomic percentages, and a+b=100 atomic percent).

25. The method for manufacturing a magnetic sensing element according to claim 17, wherein the film thickness of the non-magnetic material layer is 18 angstroms or more and 50 angstroms or less.

26. A method for manufacturing a magnetic sensing element including a pinned magnetic layer, in which the magnetization direction is pinned in one direction, and a free magnetic layer disposed on the pinned magnetic layer with a non-magnetic material layer therebetween, the method characterized by comprising the steps of:

forming the pinned magnetic layer as a laminate of a first pinned magnetic layer in contact with the non-magnetic material layer and a second pinned magnetic layer stacked on the first pinned magnetic layer;

forming the first pinned magnetic layer and the second pinned magnetic layer from metal compounds represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and specifying the atomic percentage of the element Z in the metal compound constituting the first pinned magnetic layer to be smaller than the atomic percentage of the element Z in the metal compound constituting the second pinned magnetic layer, wherein the X is at least one element of Cu, Co, Ni, Rh, Pt, Au, Pd, Ir, Ru, Ag, Zn, Cd, and Fe, the Y is at least one element of Mn, Fe, Ti, V, Zr, Nb, Hf, Ta, Cr, Co, and Ni, and the Z is at least one element of Al, Sn, In, Sb, Ga, Si, Ge, Pb, and Zn.

27. The method for manufacturing a magnetic sensing element according to claim 26, wherein the atomic percentage of the element Z in the metal compound of the second pinned magnetic layer is specified to be more than 24 atomic percent and 26 atomic percent or less.

28. The method for manufacturing a magnetic sensing element according to claim 26, wherein the atomic percentage of the element Z in the metal compound of the first pinned magnetic layer is specified to be 19 atomic percent or more and 24 atomic percent or less.

29. The method for manufacturing a magnetic sensing element according to claim 28, wherein the atomic percentage of the element Z in the metal compound of the first pinned magnetic layer is specified to be 22 atomic percent or less.

30. The method for manufacturing a magnetic sensing element according to claim 26, wherein the difference between the atomic percentage of the element Z in the metal compound of the second pinned magnetic layer and the atomic percentage of the element Z in the metal compound of the first pinned magnetic layer is specified to be 3 atomic percent or more.

31. A method for manufacturing a magnetic sensing element including a pinned magnetic layer, in which the magnetization direction is pinned in one direction, and a free magnetic layer disposed on the pinned magnetic layer with a non-magnetic material layer therebetween, the method characterized by comprising the steps of:

forming the free magnetic layer by a sputtering process in which the target is a metal compound represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and conducting film formation of the free magnetic layer at this time in such a way that the atomic percentage of the element Z in the metal compound is decreased with increasing proximity to the non-magnetic material layer side, wherein the X is at least one element of Cu, Co, Ni, Rh, Pt, Au, Pd, Ir, Ru, Ag, Zn, Cd, and Fe, the Y is at least one element of Mn, Fe, Ti, V, Zr, Nb, Hf, Ta, Cr, Co, and Ni, and the Z is at least one element of Al, Sn, In, Sb, Ga, Si, Ge, Pb, and Zn.

32. The method for manufacturing a magnetic sensing element according to claim 31, wherein the atomic percentage of the element Z in the metal compound in the neighborhood of the center of the free magnetic layer or the pinned magnetic layer is specified to be more than 24 atomic percent and 26 atomic percent or less.

33. The method for manufacturing a magnetic sensing element according to claim 31, wherein the atomic percentage of the element Z in the metal compound in the neighborhood of the interface of the free magnetic layer or the pinned magnetic layer to the non-magnetic material layer is specified to be 19 atomic percent or more and 24 atomic percent or less.

34. The method for manufacturing a magnetic sensing element according to claim 33, wherein the atomic percentage of the element Z in the metal compound in the neighborhood of the interface of the free magnetic layer or the pinned magnetic layer to the non-magnetic material layer is specified to be 22 atomic percent or less.

35. The method for manufacturing a magnetic sensing element according to claim 31, wherein the difference between the atomic percentage of the element Z in the metal compound in the neighborhood of the center of the free magnetic layer or the pinned magnetic layer and the atomic percentage of the element Z in the metal compound in the neighborhood of the interface of the free magnetic layer or the pinned magnetic layer to the non-magnetic material layer is specified to be 3 atomic percent or more.

36. A method for manufacturing a magnetic sensing element including a pinned magnetic layer, in which the magnetization direction is pinned in one direction, and a free magnetic layer disposed on the pinned magnetic layer with a non-magnetic material layer therebetween, the method characterized by comprising the steps of:

forming the pinned magnetic layer by a sputtering process in which the target is a metal compound represented by $(X_{0.67}Y_{0.33})_a Z_b$ (where a and b represent atomic percentages, and a+b=100 atomic percent) or $X_d Y_e Z_f$ (where d, e, and f represent atomic percentages, and d+e+f=100 atomic percent); and conducting film formation of the pinned magnetic layer at this time in such a way that the atomic percentage of the element Z in the metal compound is decreased with increasing proximity to the non-magnetic material layer side, wherein the X is at least one element of Cu, Co, Ni, Rh, Pt, Au, Pd, Ir, Ru, Ag, Zn, Cd, and Fe, the Y is at least one element of Mn, Fe, Ti, V, Zr, Nb, Hf, Ta, Cr, Co, and Ni, and the Z is at least one element of Al, Sn, In, Sb, Ga, Si, Ge, Pb, and Zn.

* * * * *